(12) United States Patent
Sachse et al.

(10) Patent No.: US 10,238,003 B1
(45) Date of Patent: Mar. 19, 2019

(54) HEATED COVER FOR MOUNTED ELECTRONIC DEVICE

(71) Applicant: Gamber-Johnson LLC, Stevens Point, WI (US)

(72) Inventors: Robert Sachse, Weston, WI (US); Thomas D. O'Brien, Stevens Point, WI (US); Jason Lewandowski, Stevens Point, WI (US)

(73) Assignee: Gamber-Johnson LLC, Stevens Point, WI (US)

( * ) Notice: Subject to any disclaimer, the term of this patent is extended or adjusted under 35 U.S.C. 154(b) by 0 days.

(21) Appl. No.: 15/915,675

(22) Filed: Mar. 8, 2018

Related U.S. Application Data

(60) Provisional application No. 62/613,884, filed on Jan. 5, 2018.

(51) Int. Cl.
*G06F 1/16* (2006.01)
*H05B 3/34* (2006.01)
*H05K 5/03* (2006.01)
*H05K 7/20* (2006.01)

(52) U.S. Cl.
CPC ............... *H05K 7/20* (2013.01); *H05B 3/342* (2013.01); *H05K 5/03* (2013.01); *G06F 1/1632* (2013.01)

(58) Field of Classification Search
CPC ... A45C 11/00; A45C 2011/003; A45C 13/02; A45C 2013/025; A45C 2011/002; A45C 3/02; A45C 13/008; A45C 13/36; A45C 2200/10; A45C 2200/15; A45C 15/00; A45C 2011/001; A45C 3/00; A45C 5/03
See application file for complete search history.

(56) References Cited

U.S. PATENT DOCUMENTS

| 2,615,112 | A | | 10/1952 | Lagan, Jr. | |
|---|---|---|---|---|---|
| 4,019,340 | A | | 4/1977 | Conklin | |
| 4,065,336 | A | | 12/1977 | Conklin | |
| 4,066,231 | A | * | 1/1978 | Bahner | B43M 99/00 248/289.11 |
| 5,454,471 | A | * | 10/1995 | Norvell | A47J 47/145 206/545 |
| 5,484,983 | A | | 1/1996 | Roell | |

(Continued)

FOREIGN PATENT DOCUMENTS

| CN | 105708086 | 6/2016 |
|---|---|---|
| DE | 202017002990 | 7/2017 |
| EP | 2484248 | 8/2012 |

*Primary Examiner* — Tu B Hoang
*Assistant Examiner* — Vy T Nguyen
(74) *Attorney, Agent, or Firm* — Michael Best & Friedrich, LLP

(57) ABSTRACT

A cover for surrounding both an electronic device and a support on which the electronic device is retained includes a first portion defining a back of the cover to be positioned behind the electronic device and behind the support. The first portion includes at least one aperture for receiving a mounting member configured to mount the support to a structure. The cover further includes a second portion defining a front of the cover. The second portion defines therein a cavity sized and configured such that when connected to the first portion about an outer periphery of the second portion, the cavity encloses the electronic device and the support. A heating element is coupled to the second portion and operable to heat the cavity.

24 Claims, 22 Drawing Sheets

(56) References Cited

U.S. PATENT DOCUMENTS

| | | | | |
|---|---|---|---|---|
| 5,682,993 | A * | 11/1997 | Song | A45F 3/02 206/320 |
| 5,859,762 | A * | 1/1999 | Clark | F16M 11/10 248/122.1 |
| 6,111,233 | A | 8/2000 | Rock et al. | |
| 6,373,034 | B1 | 4/2002 | Rock et al. | |
| 6,426,869 | B1 * | 7/2002 | White | B60N 3/001 108/44 |
| 7,034,251 | B1 | 4/2006 | Child et al. | |
| 7,316,313 | B1 * | 1/2008 | Juchau | B65D 81/3476 190/109 |
| 7,384,087 | B2 * | 6/2008 | Littlejohn | B60R 11/0252 108/50.01 |
| 7,491,912 | B1 * | 2/2009 | Check | F24C 7/10 205/495 |
| 7,508,351 | B2 | 3/2009 | Greenleaf et al. | |
| 8,952,301 | B2 | 2/2015 | Naylor et al. | |
| 9,155,366 | B2 * | 10/2015 | Hwang | A45C 11/00 |
| 9,329,631 | B2 | 5/2016 | Bramah et al. | |
| 9,402,016 | B1 * | 7/2016 | Hidalgo | H04N 5/2251 |
| 2005/0219407 | A1 | 10/2005 | Rice et al. | |
| 2006/0279250 | A1 * | 12/2006 | Keely | G06F 1/1628 320/103 |
| 2007/0188990 | A1 | 8/2007 | Wallace | |
| 2008/0230160 | A1 * | 9/2008 | Huang | A45C 11/00 150/165 |
| 2009/0114633 | A1 | 5/2009 | Naylor et al. | |
| 2009/0140561 | A1 * | 6/2009 | Cottrell | A47C 7/72 297/217.1 |
| 2011/0267748 | A1 * | 11/2011 | Lane | A45F 5/00 361/679.01 |
| 2011/0319146 | A1 | 12/2011 | Wilford | |
| 2012/0091025 | A1 * | 4/2012 | Wyner | A45C 11/00 206/523 |
| 2012/0292304 | A1 | 11/2012 | Burchard et al. | |
| 2013/0092562 | A1 | 4/2013 | Wyner et al. | |
| 2013/0105138 | A1 | 5/2013 | Burchard et al. | |
| 2013/0220841 | A1 * | 8/2013 | Yang | A45C 11/00 206/37 |
| 2013/0256478 | A1 * | 10/2013 | Reda | B60R 11/02 248/205.1 |
| 2014/0293536 | A1 * | 10/2014 | Bramah | G06F 1/1632 361/679.55 |
| 2014/0356658 | A1 | 12/2014 | Rogers | |
| 2015/0068933 | A1 * | 3/2015 | So | A45F 5/021 206/316.1 |

* cited by examiner

HEATED COVER FOR MOUNTED ELECTRONIC DEVICE

RELATED APPLICATIONS

This application claims the benefit of U.S. Provisional Patent Application No. 62/613,884 filed on Jan. 5, 2018, the entire content of which is hereby incorporated by reference herein.

BACKGROUND

The present invention relates to covers for electronic devices.

Electronic devices have become more robust and durable, enabling them to be used in extreme working environments. Cases have been designed to help protect these devices from debris, from impact, and from other harmful external forces. Mounts have also been designed to support electronic devices for use in harsh environments.

SUMMARY

The invention provides a heated cover designed to cover an electronic device that is secured in or on a support, such as a device holder or a device docking station. The cover is designed to surround both the electronic device as well as the support, and includes a heating element operable to generate heat within the cover, thereby providing a heated environment within the cover for the electronic device and the support. The cover enables the use of mounted electronic devices in cold environments, such as in cold outdoor climates, or in large freezers and refrigerators.

In one aspect, the invention provides a cover for surrounding both an electronic device and a support on which the electronic device is retained. The cover includes a first portion defining a back of the cover to be positioned behind the electronic device and behind the support. The first portion includes at least one aperture for receiving a mounting member configured to mount the support to a structure. The cover further includes a second portion defining a front of the cover. The second portion defines therein a cavity sized and configured such that when connected to the first portion about an outer periphery of the second portion, the cavity encloses the electronic device and the support. A heating element is coupled to the second portion and operable to heat the cavity.

In another aspect, the second portion further includes (a) translucent material for viewing the electronic device through the second portion, or (b) an opening for providing access into and out of the cavity. The second portion is pivotable relative to the first portion between a closed position, in which the outer periphery of the second portion is connected to the first portion, and an open position, in which at least part of the outer periphery of the second portion is spaced apart from the first portion.

In yet another aspect, the invention provides a system including a support for an electronic device and a cover for surrounding the support. The cover includes a first portion defining a back of the cover to be positioned behind the support. The first portion includes at least one aperture for receiving a mounting member configured to mount the support to a structure. The cover further includes a second portion defining a front of the cover. The second portion defines therein a cavity sized and configured such that when connected to the first portion about an outer periphery of the second portion, the cavity encloses the support. A heating element is coupled to the second portion and operable to heat the cavity.

Other aspects of the invention will become apparent by consideration of the detailed description and accompanying drawings.

DETAILED DESCRIPTION

Figure 1:
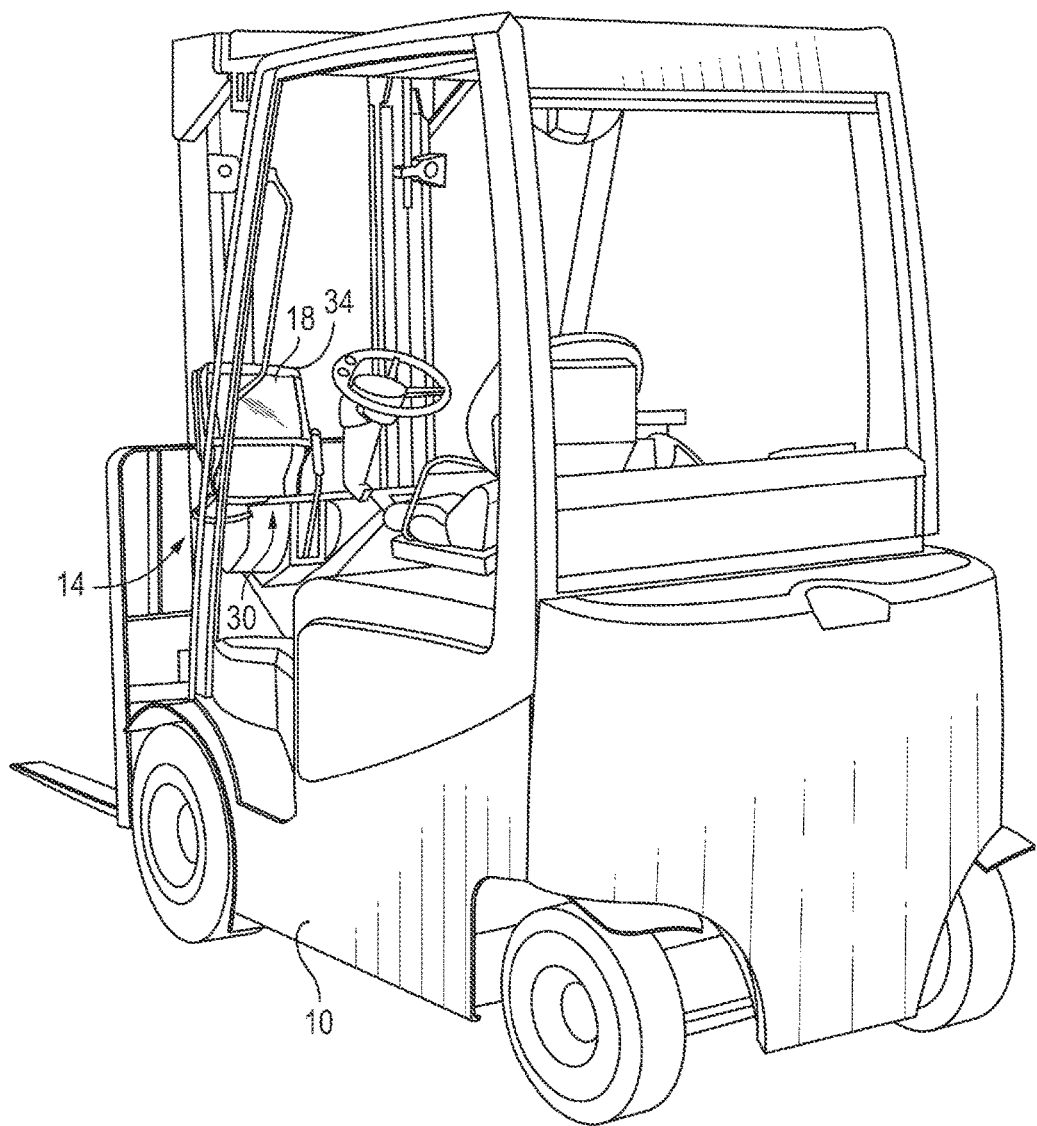
FIG. 1 is a perspective view of a vehicle having mounted thereon an electronic device heating system according to the present invention.

Before any embodiments of the invention are explained in detail, it is to be understood that the invention is not limited in its application to the details of construction and the arrangement of components set forth in the following description or illustrated in the following drawings. Use of relative terms such as "right," "left," "front," "back," "lower," "upper," "over," "under," "up," "down," "top," "bottom," and "behind" as well as derivatives of such terms (e.g., "downwardly" and "upwardly") should be construed to refer to exemplary orientation as then described or as shown in the drawing under discussion. These relative terms are for convenience of description and do not require that the apparatus be constructed or operated in a particular orientation. The invention is capable of other embodiments and of being practiced or of being carried out in various ways.

FIG. 1 illustrates a vehicle 10 having mounted thereon an electronic device heating system 14 of the present invention. The illustrated vehicle 10 is a forklift, however, the system 14 of the present invention can be used with other types of vehicles as well (e.g., ATV's, skid steer loaders, dune buggies, golf carts, tractors, construction equipment, agricultural equipment, etc.). Mounting electronic devices, such as computers, onto forklifts and other vehicles 10 is known. However, when the vehicle 10 is used in cold environments, such as outdoors in cold climates, or in large refrigerators or freezers, the cold environment can be problematic to the operation of the electronic device, and also hinder the functionality of any electronics in the mount or support (e.g., a docking station) in or on which the electronic device is held.

The invention provides a system 14 for protecting and heating an electronic device and its support in a mounted arrangement. The system 14 includes an electronic device 18, which in the illustrated embodiment is a computer such as a tablet computer. Other types of electronic devices can also be part of the inventive system. For example, FIGS. 14-24 illustrate another system 14' in which the electronic device 18' is a printer. Other electronic devices, such as smart phones, notebook computers, and the like are also contemplated.

The system further includes a support 22, which in the illustrated embodiment of FIG. 1-13 is a computer docking station (e.g., a TabCruzer® docking station available from Gamber-Johnson, LLC of Stevens Point, Wis.). The docking station 22 removably receives and supports the tablet computer 18 and can include an electrical connector that electrically connects to the computer 18 for power and/or data transfer. In other embodiments, the support may be a device holder that does not include an electrical connector or other electronics, but rather functions only to hold or retain the electronic device 18. In yet other embodiments, such as that shown in FIGS. 14-24, the support 22' is a printer mounting bracket. The support 22 includes one or more mounting members or fasteners 26 (see FIGS. 4, 10 and 11) for mounting the support 22 to a structure 30, such as the support post shown in FIGS. 1 and 2, or to other structure including portions of frames or housings of vehicles 10, walls, desks, tables, movable carts, and the like.

The system 14 further includes a cover 34 sized and configured to surround and at least partially enclose both the support 22 and the electronic device 18 held thereon. The cover 34 is designed to fit around the support 22 and the retained electronic device 18 in a manner that allows a heating element 38 (shown schematically in FIGS. 12 and 13) in the cover to provide a heated environment for the support 22 and the device 18. The cover 34 is also designed to provide the heated environment in a flexible manner that minimizes limitations on the accessibility, removability, and connectivity of and to the device 18 and the support 22. The cover 34 is made of any durable fabric capable of withstanding the intended environment of use. In the illustrated embodiment, the cover 34 is made from polyester.

Figure 3:
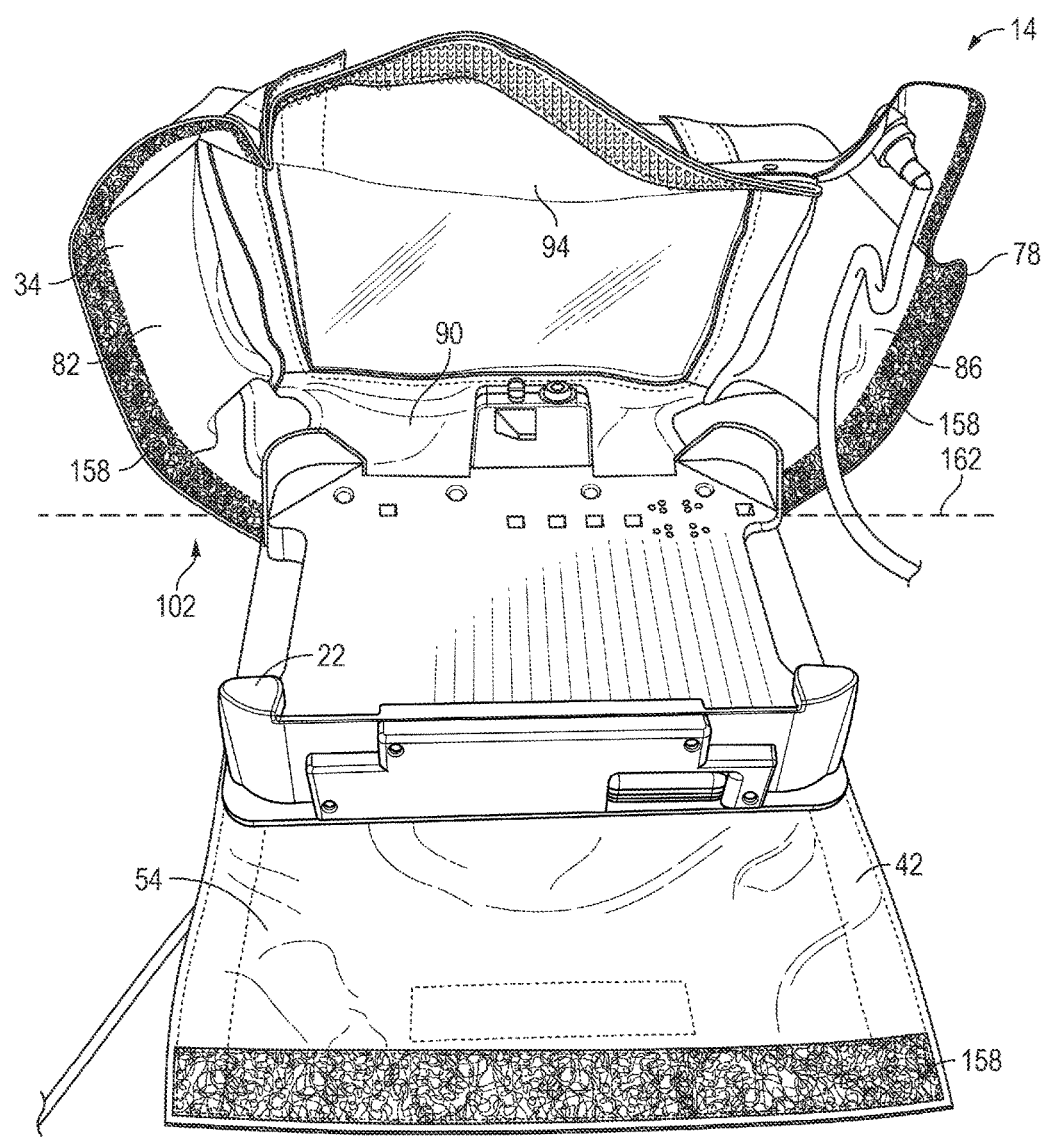
FIG. 3 is a perspective view of the electronic device heating system of FIG. 1, shown removed from the vehicle and in the open position.
Figure 4:
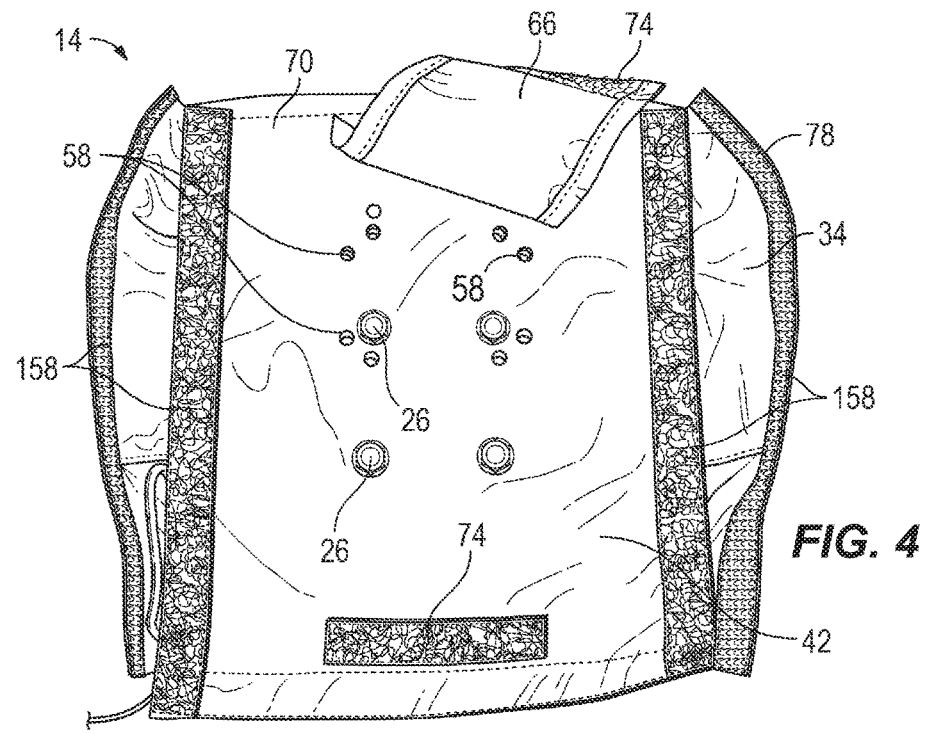
FIG. 4 is a rear view of the electronic device heating system of FIG. 1, shown with an optional flap in a released position.
Figure 5:
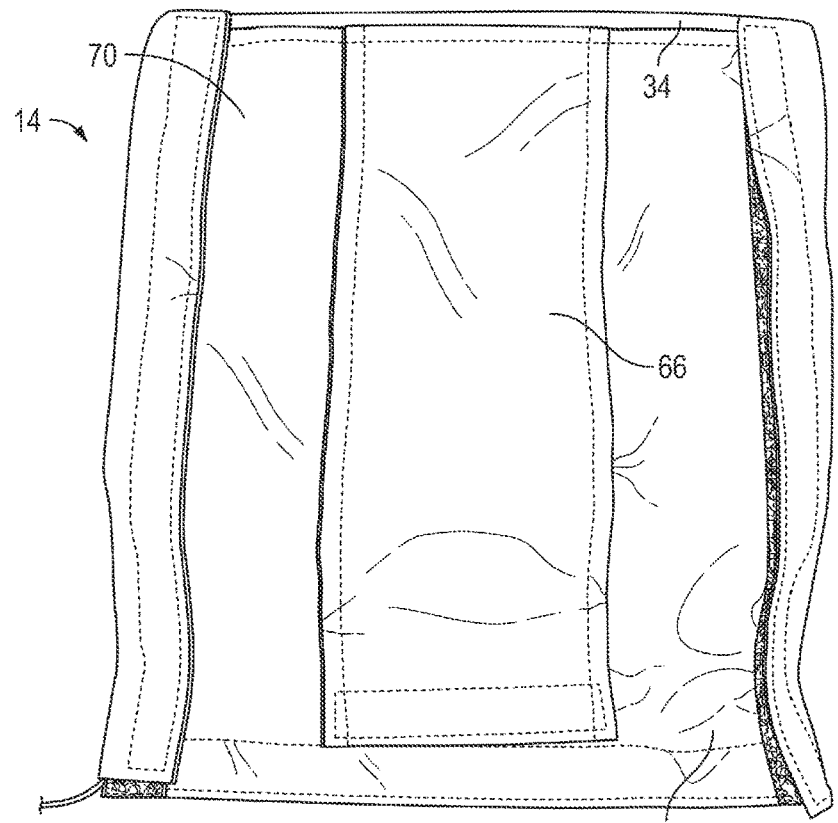
FIG. 5 is a rear view of the electronic device heating system of FIG. 1, shown with the optional flap in a secured position.

With reference to FIGS. 3-5, the cover 34 includes a first or back portion 42 that defines a back or rear of the cover 34, which when in use, is positioned behind the support 22 and is therefore also behind the electronic device 18. The first portion 34 is generally rectangular in shape, can lie flat in a single plane, has a length that is longer than a length of the support 22, and has a width that is about the same as, or slightly wider than a width of the support 22. In this manner, the first portion 42 can cover the rear surface 46 of the support 22. The first portion 42 is illustrated as being flexible since it is made from fabric that is not structurally reinforced. The system 14 can include an optional rigid plate 50 sized and configured to engage an inner surface 54 of the first portion 42. The rigid plate 50 provides an intervening rigid layer between the first portion 42 and the rear surface 46 of the support to facilitate a proper fit and placement of the first portion 42 relative to the support 22.

Figure 10:
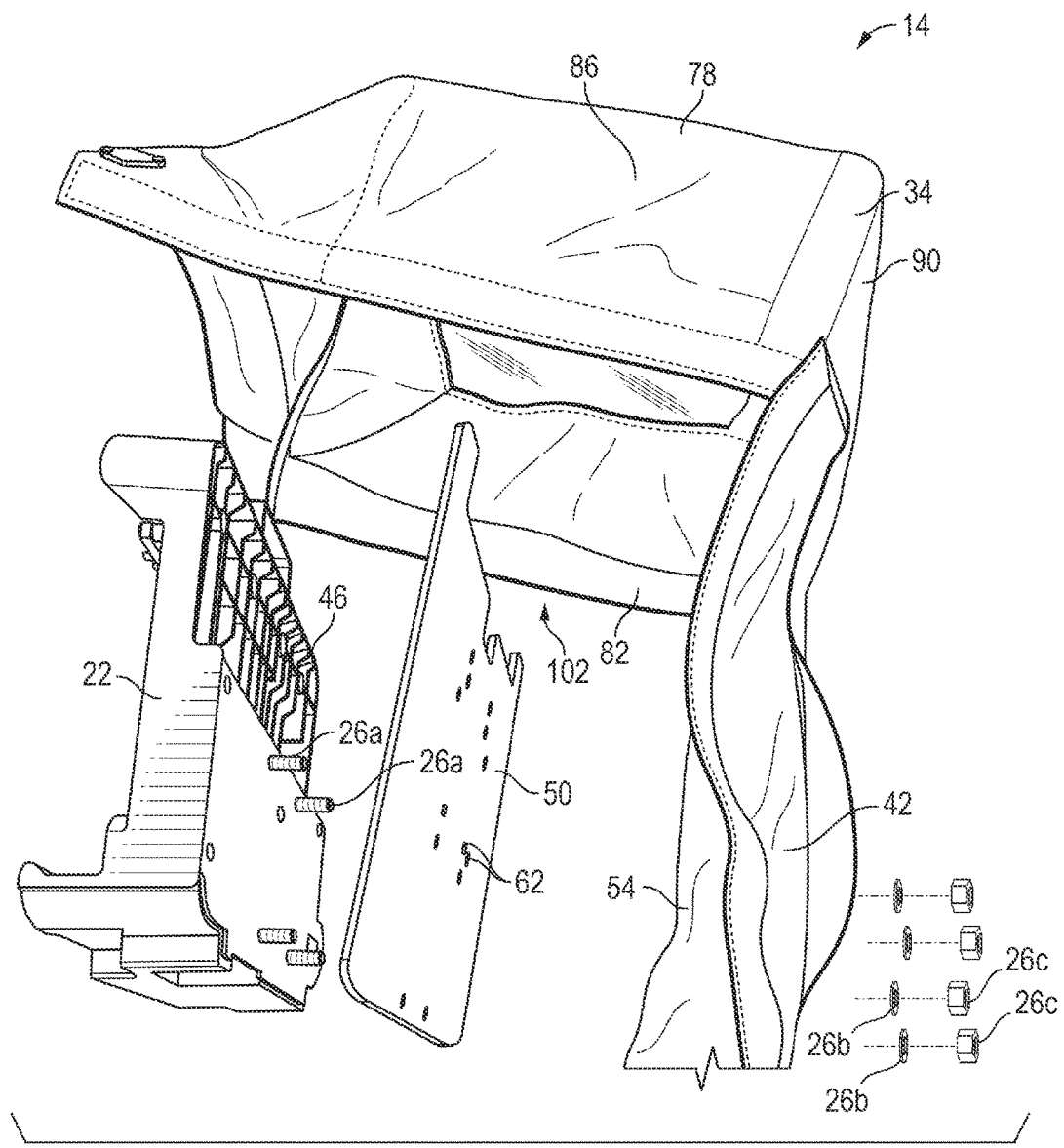
FIG. 10 is an exploded view of the electronic device heating system of FIG. 1.
Figure 11:
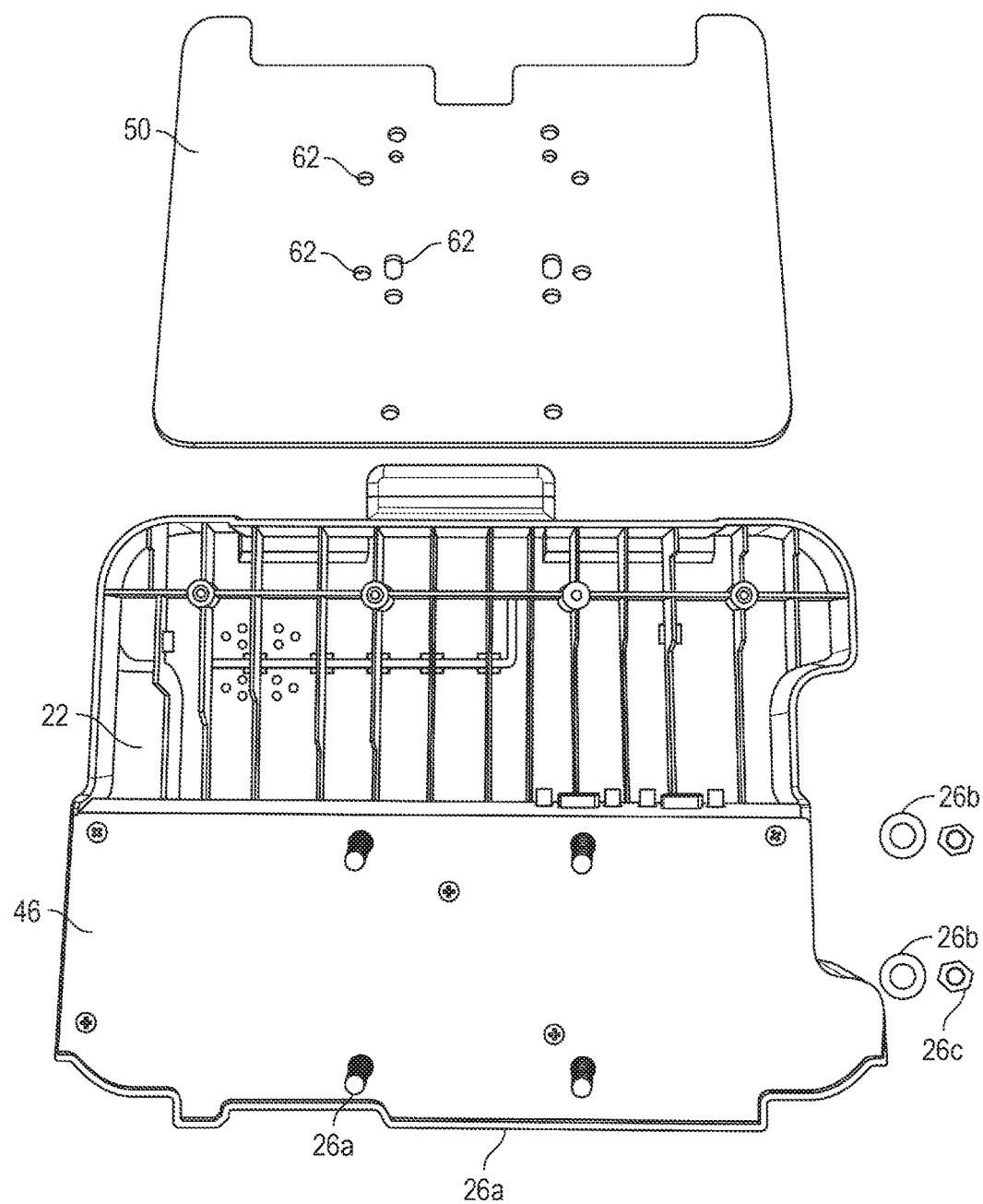
FIG. 11 is a rear view of a support and a rigid plate of the electronic device heating system of FIG. 1, shown with the cover removed.

As seen in FIG. 4, the first portion 42 includes at least one, and in the illustrated embodiment, a plurality of apertures 58 sized, configured, and positioned about the first portion 42 to receive mounting members/fasteners 26 that mount the support 22 to the structure 30. Multiple apertures 58 can be positioned about the first portion 42 to enable many different supports 22 to be mounted to many different structures 30 in many different manners. While the illustrated embodiment utilizes four of the apertures 58 for mounting, other apertures are shown that may be used with other supports 22 and other mounting applications. As shown in FIGS. 10 and 11, the fasteners 26 can include bolts 26a that extend from the rear surface 46 of the support 22, washers 26b and nuts 26c. The rigid plate 50 also includes apertures 62 positioned in the same manner so as to be aligned with the apertures 58 in the first portion 42. Therefore, the bolts 26a extending from the rear surface 46 of the support 22 pass through the aligned apertures 62 in the rigid plate 50 and through the aligned apertures 58 in the first portion 42. The rigid plate 58 can therefore help to maintain the integrity and positioning of the first portion 42 relative to the support 22. The bolts 26a can then extend through apertures or slots in the structure 30 and be secured using the washers 26b and nuts 26c. The apertures 58 can be formed (e.g, cut, punched, etc.) directly in the fabric material of the first portion 42, and in some embodiments, can be reinforced by stitching around the perimeter of the apertures 58 or by including reinforcing rings (not shown) sewn or otherwise attached about the apertures 58. Of course, those skilled in the art will understand that other mounting members besides nuts, bolts, and washers can also be used to secure the system 14 to a structure 30.

FIGS. 4 and 5 illustrate an optional movable flap 66 that is coupled (e.g., stitched) to an outer surface 70 of the first portion 42. The movable flap 66 is sized and configured to substantially cover all of the apertures 58 in the first portion 42 to inhibit water and debris from entering the cover 34 through apertures 58 that are not being used to mount the system 14 to the structure 30. A releasable closure arrangement, such as hook and loop fasteners 74, can be provided on the flap 66 and on the outer surface 70 of the first portion 42 to selectively and releasably secure the flap 66 between a secured position, in which the flap 66 covers the apertures 58 (see FIG. 5), and a released position in which the apertures, and therefore the mounting members 26, are accessible (see FIG. 4). The flap 66 will also cover part of the structure 30 to which the system 14 is mounted when in its secured position. In other embodiments, other types of fastener arrangements 74 could be used, such as zippers, snaps, buttons, and the like.

Figure 6:
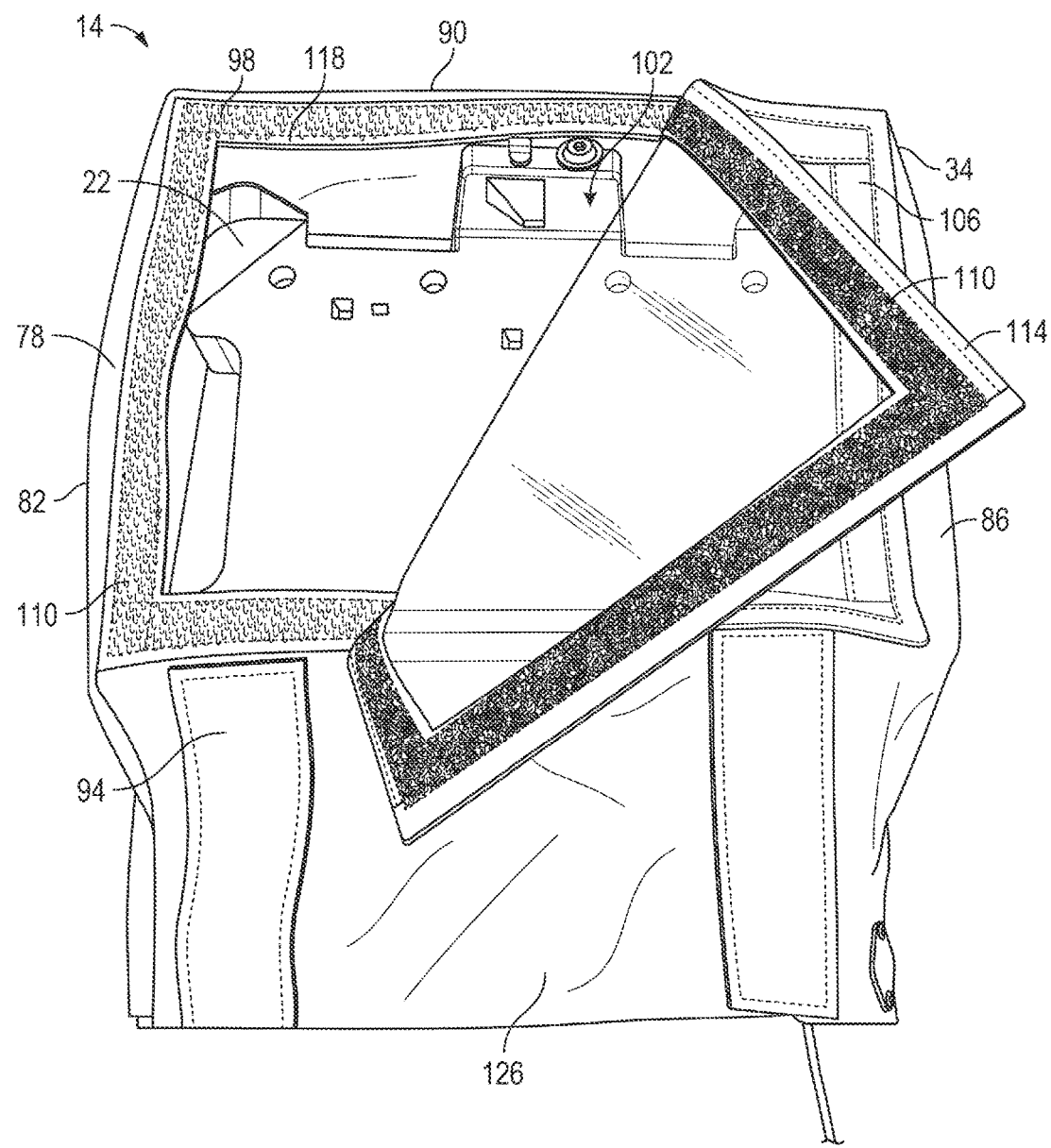
FIG. 6 is a front perspective view of the electronic device heating system of FIG. 1, shown with a translucent viewing window partly removed from the cover.

With reference to FIGS. 3, 6, and 10, the cover 34 further includes a second or front portion 78 that defines a front of the cover 34 operable to surround and cover the front and sides of the support 22 and the retained electronic device 18. The second portion 78 includes first and second generally parallel sidewalls 82, 86, respectively, a third or top wall 90 interconnecting the first and second sidewalls 82, 86, and a fourth or bottom wall 94 opposite the third wall 90 and also interconnecting the first and second sidewalls 82, 86. A fifth or outer wall 98 interconnects with each of the walls 82, 86, 90, and 94 so that together, all of the walls 82, 86, 90, 94, and 98 define therein a cavity 102 sized and configured to receive and protect the support 22 and the retained electronic device 18. The walls 82, 86, 90, 94, and 98 are sized and configured such that the cavity 102 is sized and shaped to snugly enclose and encapsulate the support 22 and the retained device 18. The walls 82, 86, 90, 94, and 98 can be constructed and coupled together in various suitable manners, including integrally forming some walls with others, stitching or otherwise permanently connecting separate fabric panels together, and/or releasably securing the walls 82, 86, 90, 94, and 98 (or portions thereof) together as will be discussed in further detail below.

Figure 2:
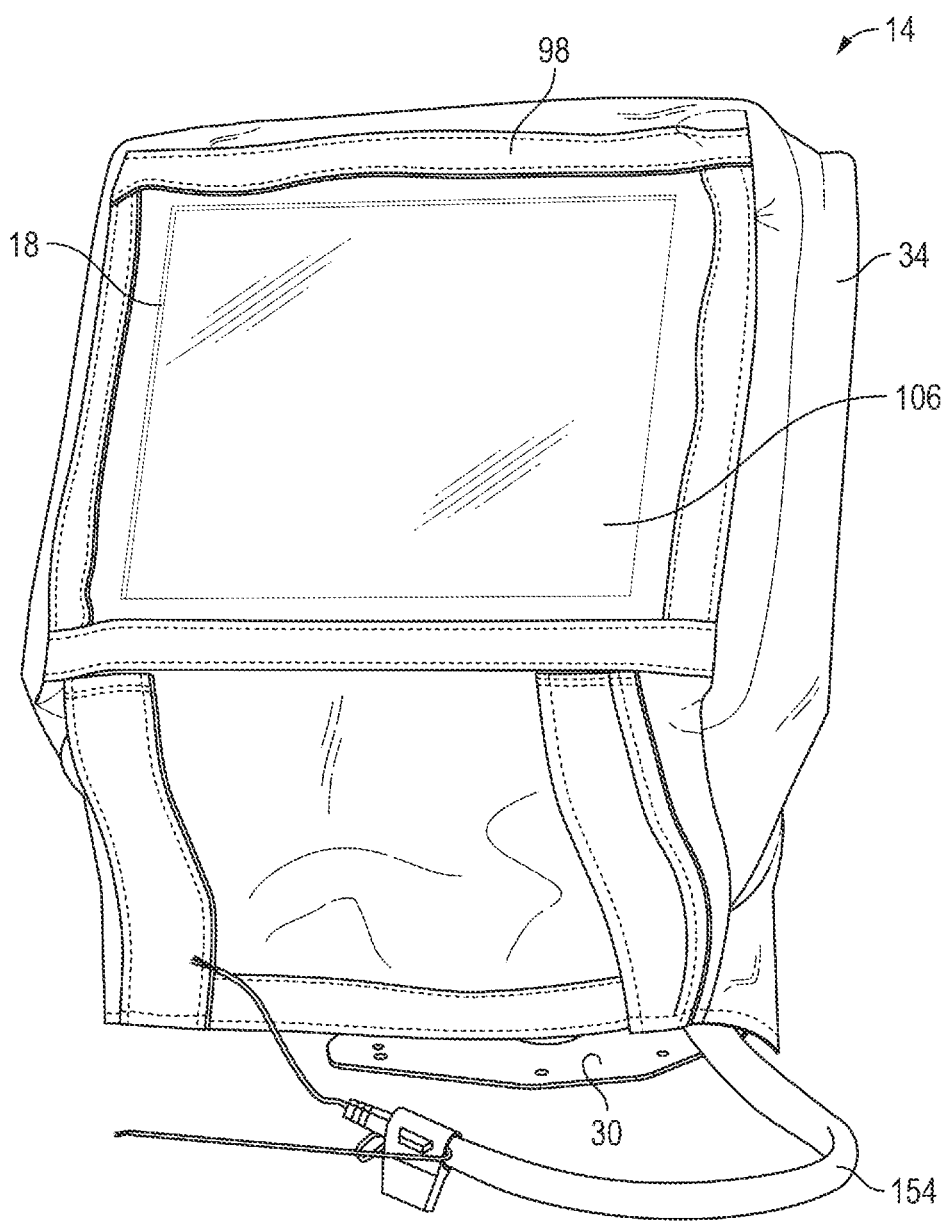
FIG. 2 is a perspective view of the electronic device heating system of FIG. 1, shown removed from the vehicle and in the closed position.

As best seen in FIGS. 2 and 6, the outer wall 98 includes a translucent material 106 coupled thereto that enables viewing the electronic device 18 therethrough. The translucent material 106 is preferably a flexible clear plastic material 106 that allows the user to see the screen of the device 18 and also enables a user to operate a touch screen functionality of the device 18 by touching the screen through the plastic material 106. In the illustrated embodiment, the translucent material 106 is removably coupled to the outer wall 98 of the second portion 78 using a removable fastener arrangement 110 (see FIG. 6), which is shown as including hook and loop fasteners on an inside surface 114 of the translucent material 106 and on an outside surface 118 of the outer wall 98. The removable fastener arrangement 110 allows for quick access directly to the device 18 if needed, but also allows a user to replace the translucent material 106 if it were to get scratched, ripped, or otherwise marred or stained such that viewing of the device 18 became difficult. If the system 14 is used in applications that go between cold and warm environments, such that condensation might form on the translucent material 106, the translucent material panel can simply be removed as the heating element 38 will still adequately heat the cavity 102. In other embodiments, other types of removable fastener arrangements 110 could be used, such as zippers, snaps, buttons, and the like. In yet other embodiments, the translucent material 106 can be permanently connected to the outer wall 98 so that it cannot be removed, or could be permanently connected along just one side to enable partial pivotal opening of the translucent material 106. In yet other embodiments, the outer wall 98 need not include any translucent material (see eg. outer wall 98' in the system 14').

Figure 7:
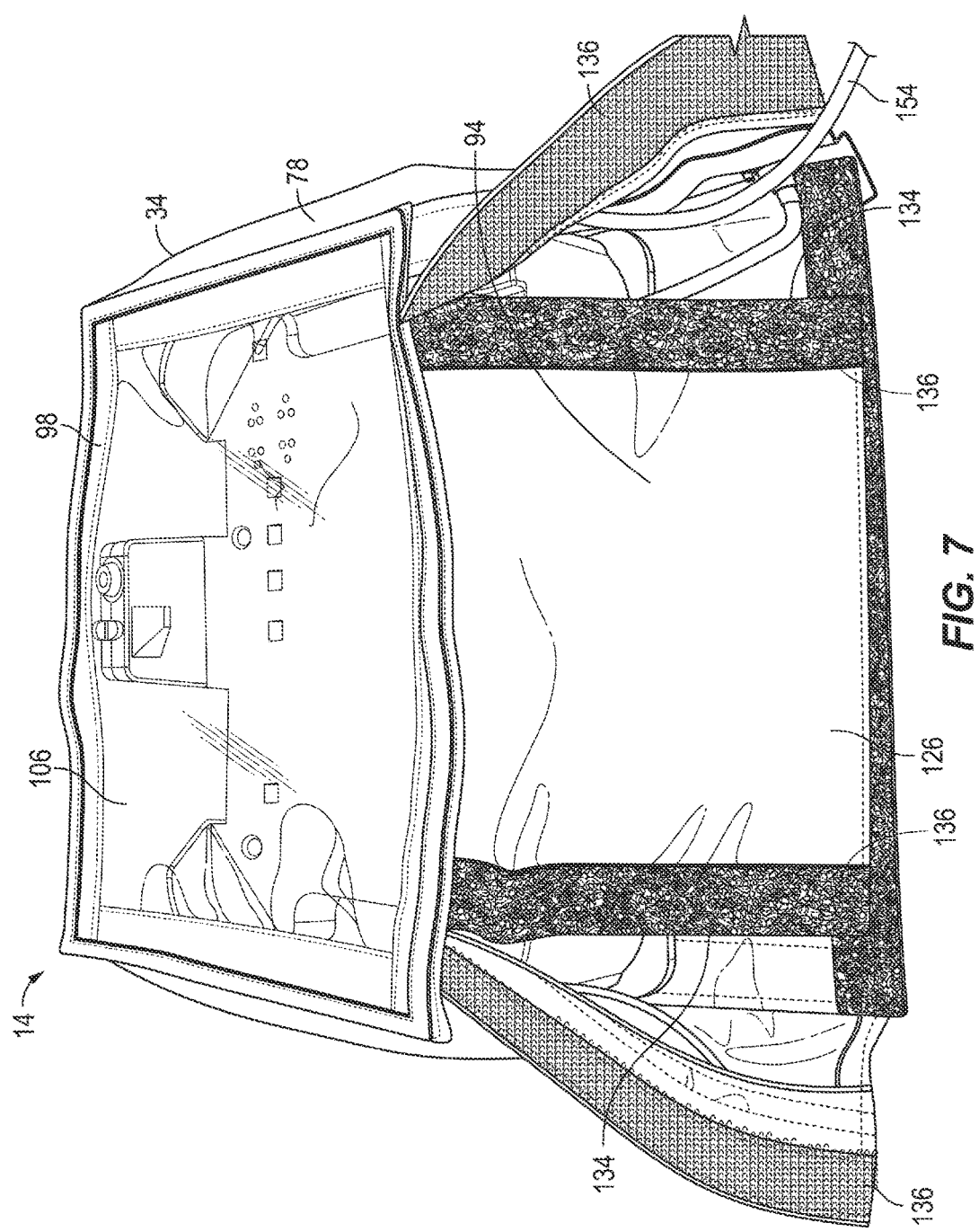
FIG. 7 is a bottom perspective view of the electronic device heating system of FIG. 1.
Figure 8:
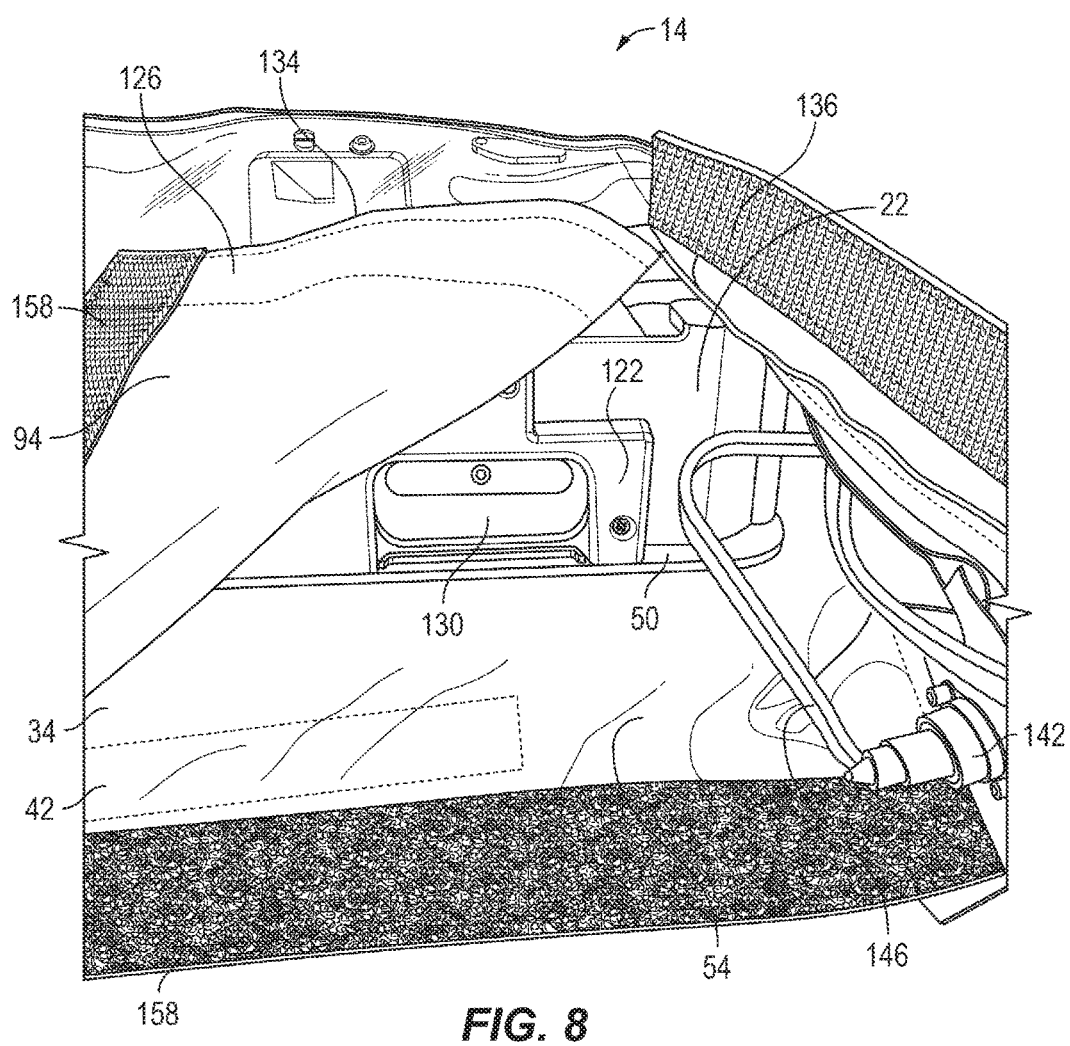
FIG. 8 is an enlarged, partial bottom perspective view of the electronic device heating system of FIG. 1, showing an access point through the cover to the support.

Referring now to FIGS. 6-8, the bottom wall 94 is configured to cover the bottom surface 122 (see FIG. 8) of the support 22 and the device 18, and also extends further to align with a bottom edge of the first portion 42. In the illustrated embodiment, the bottom wall 94 includes a flap 126 that is at least partly releasably engaged with a remainder of the bottom wall 94 to provide access for connectors or leads to extend from inside the cavity 102 to outside the cover 34 through the bottom wall 94. For example, the bottom surface 122 of the support 22 may include a port 130 (see FIG. 8) to which connectors or leads might be connected for an antenna, power, data input, and/or data output to the support 22 and/or the device 18. In the illustrated embodiment, the flap 126 includes spaced-apart side edges 134 having hook and loop fasteners 136 that engage with mating hook and loop fasteners 136 along the remainder of the bottom wall 94 to close the bottom wall 94. In other embodiments, different types of fasteners, such as zippers, snaps, buttons, and the like can be used. By having the fasteners along both side edges 134, the bottom wall 94 provides flexibility for running the connectors or leads out of the bottom wall 94 at different locations.

Figure 12:
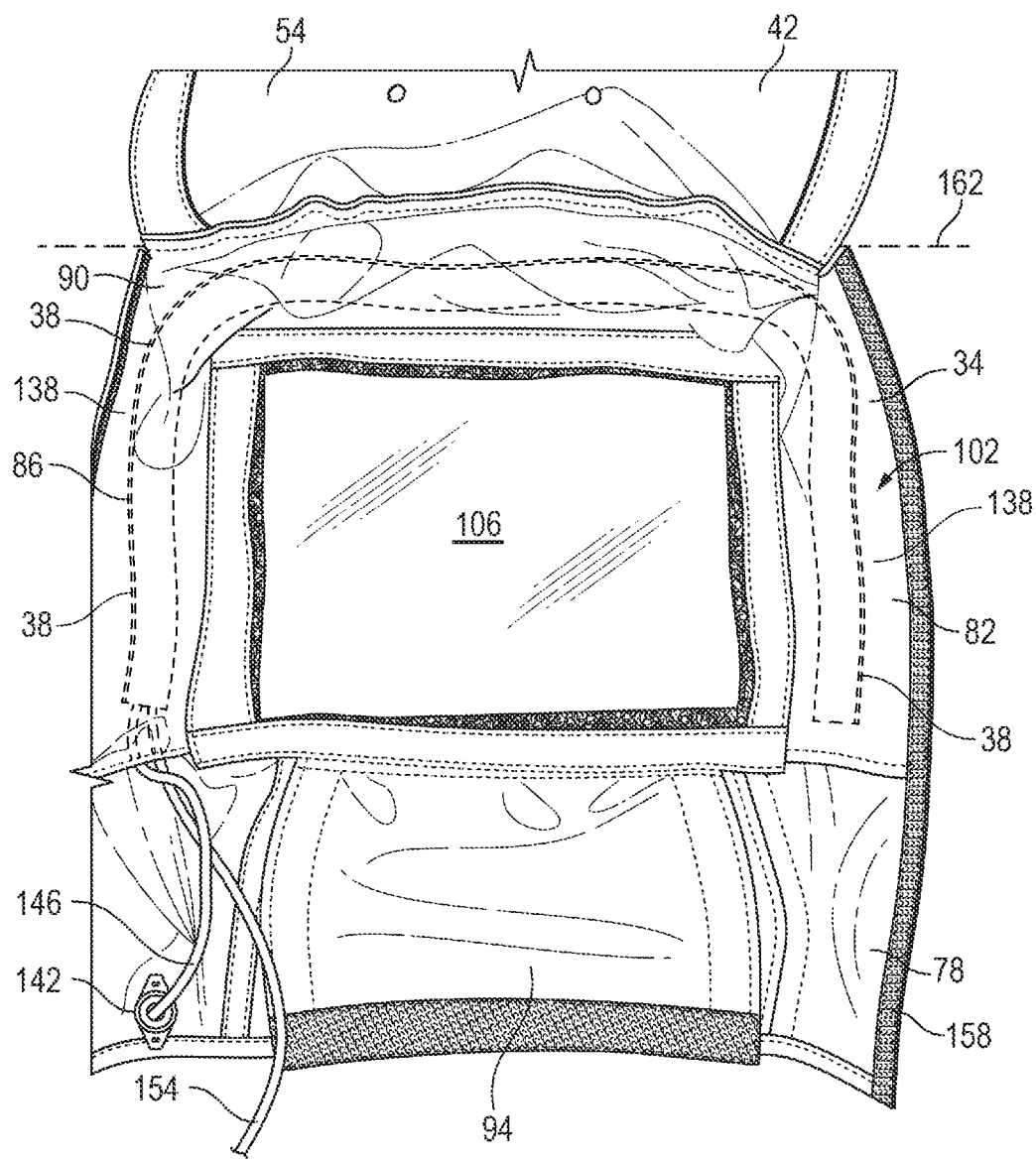
FIG. 12 is a rear view of the cover of the electronic device heating system of FIG. 1, shown with a first portion pivoted relative to a second portion.
Figure 13:
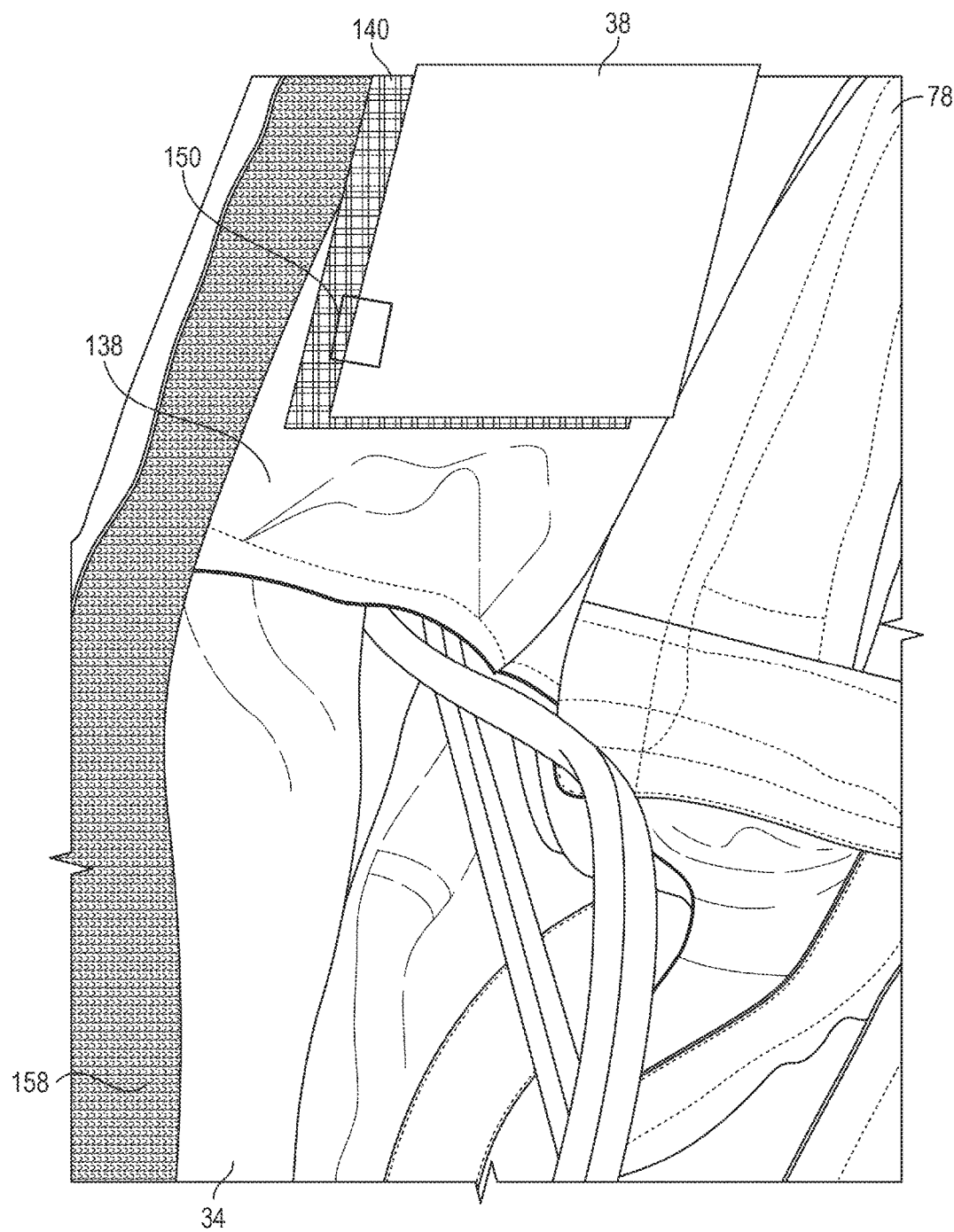
FIG. 13 is an enlarged partial perspective view illustrating wire leads for a heating element extending from a pocket in the cover.
Figure 14:
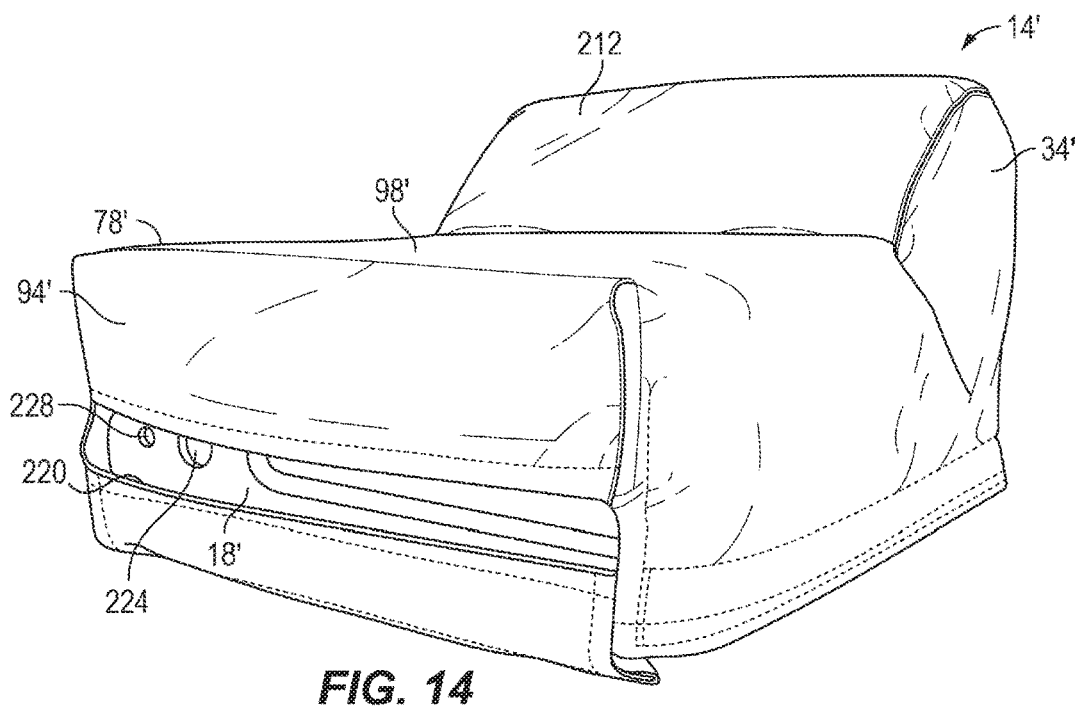
FIG. 14 is a front perspective view of another electronic device heating system embodying the present invention.
Figure 15:
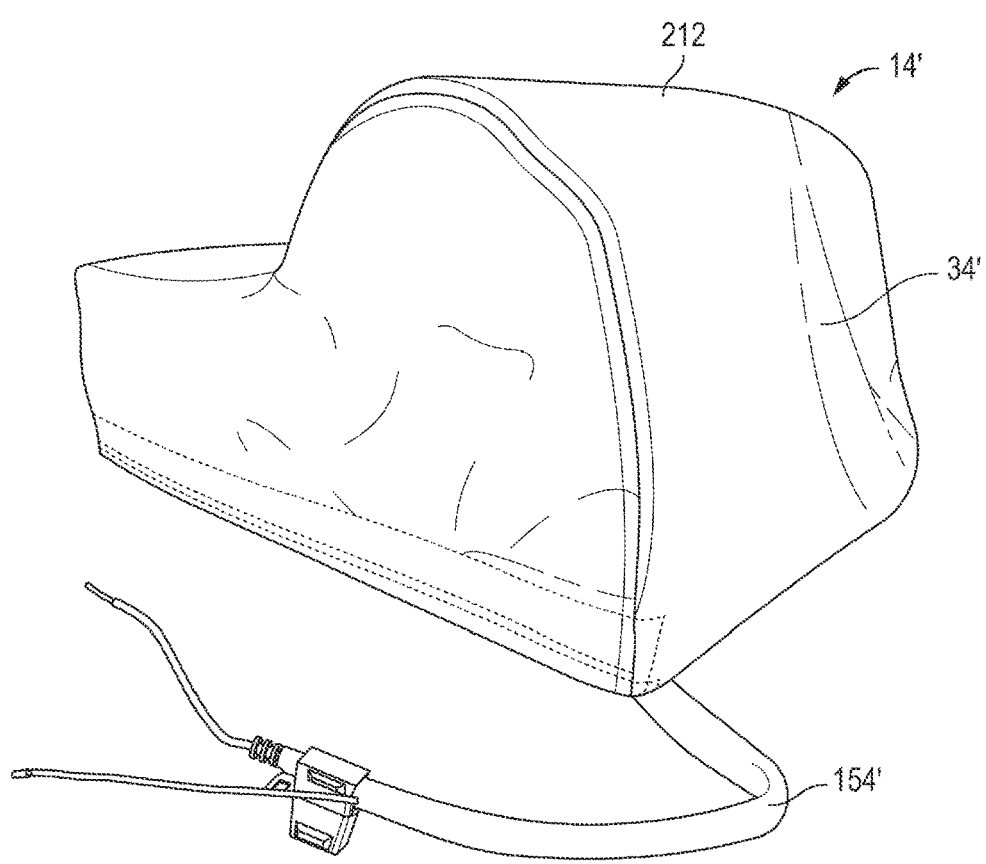
FIG. 15 is a rear perspective view of the electronic device heating system of FIG. 14.
Figure 16:
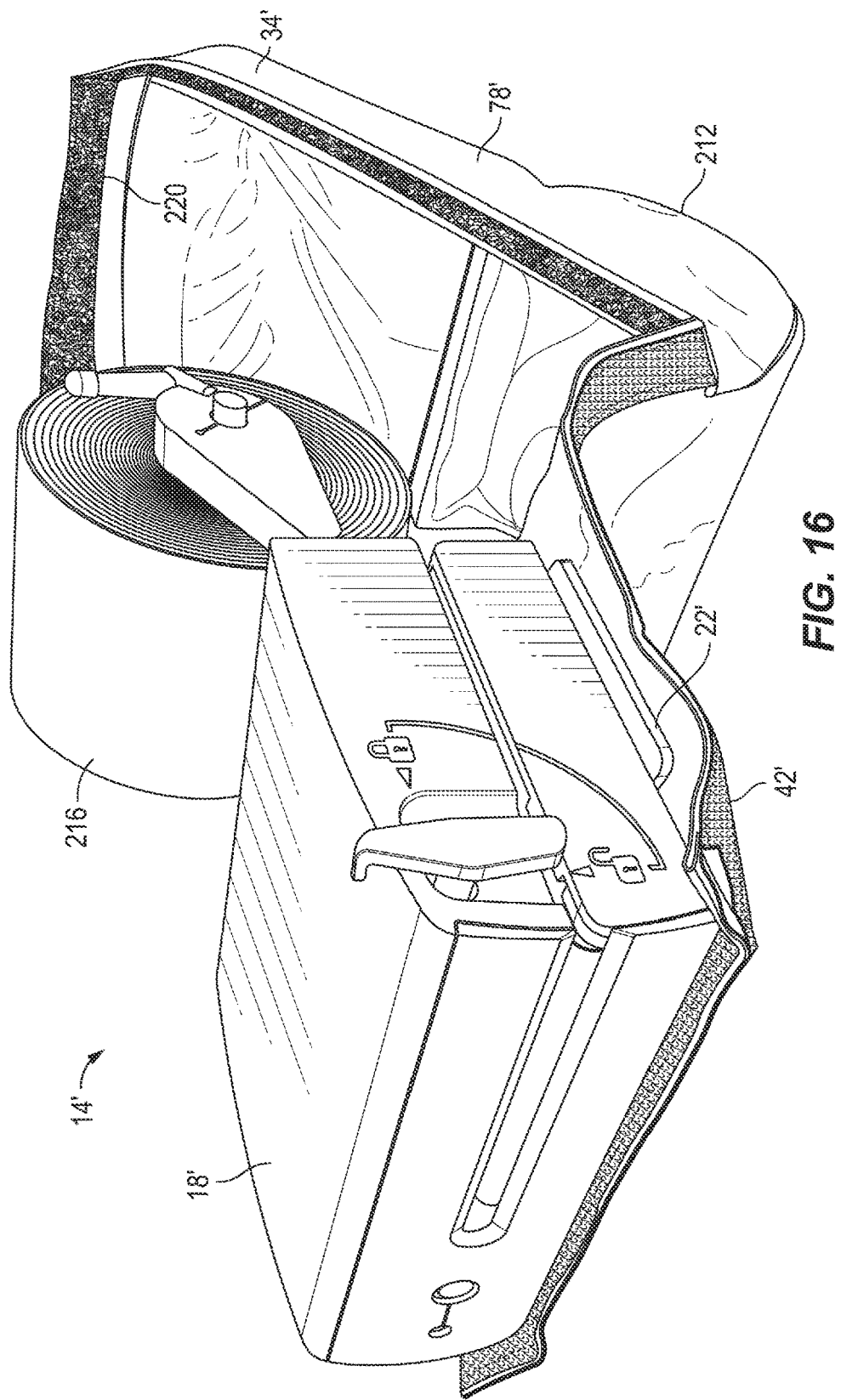
FIG. 16 is a front right perspective view of the electronic device heating system of FIG. 14, shown in the open position.
Figure 17:
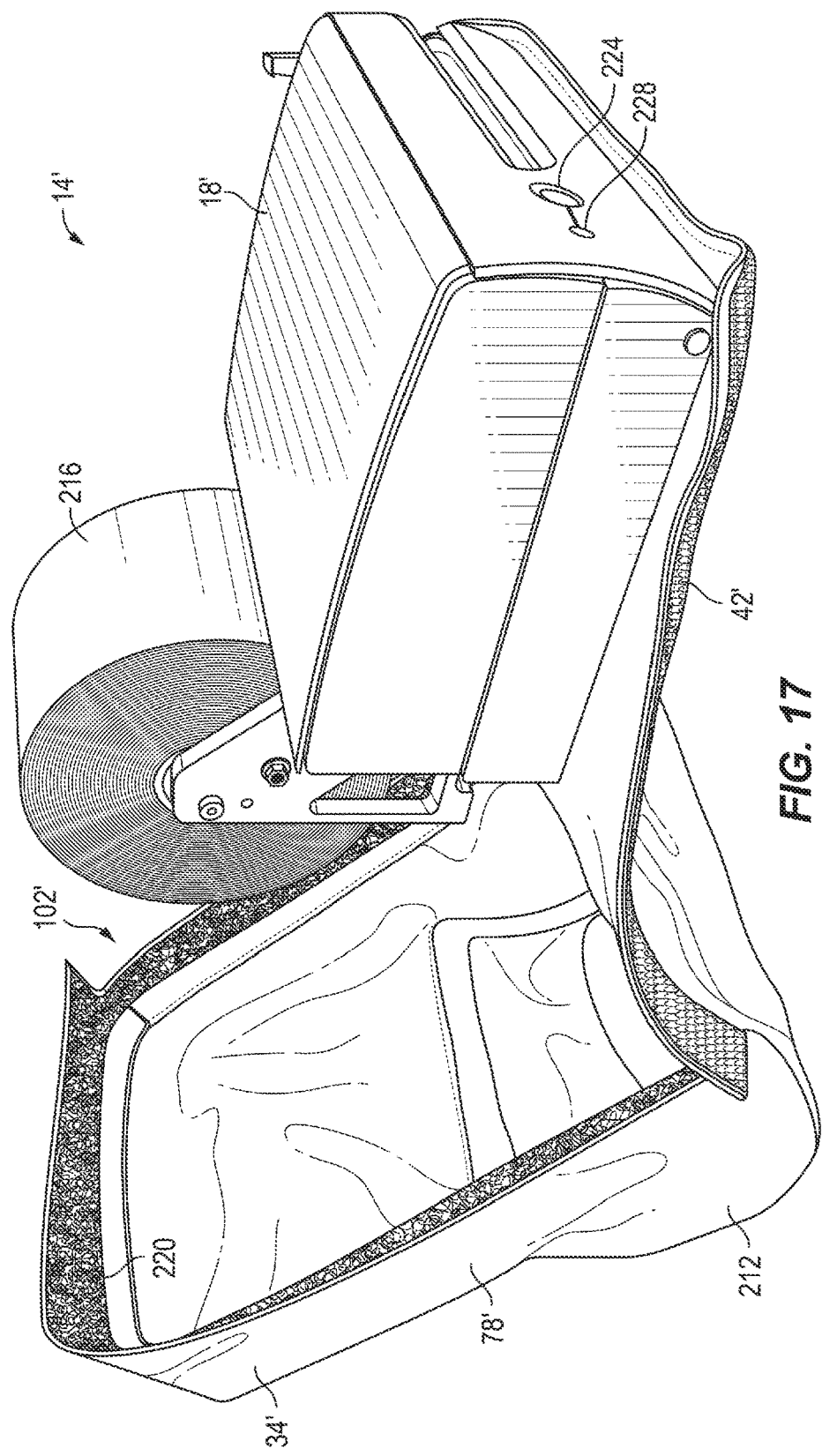
FIG. 17 is a front left perspective view of the electronic device heating system of FIG. 14, shown in the open position.
Figure 18:
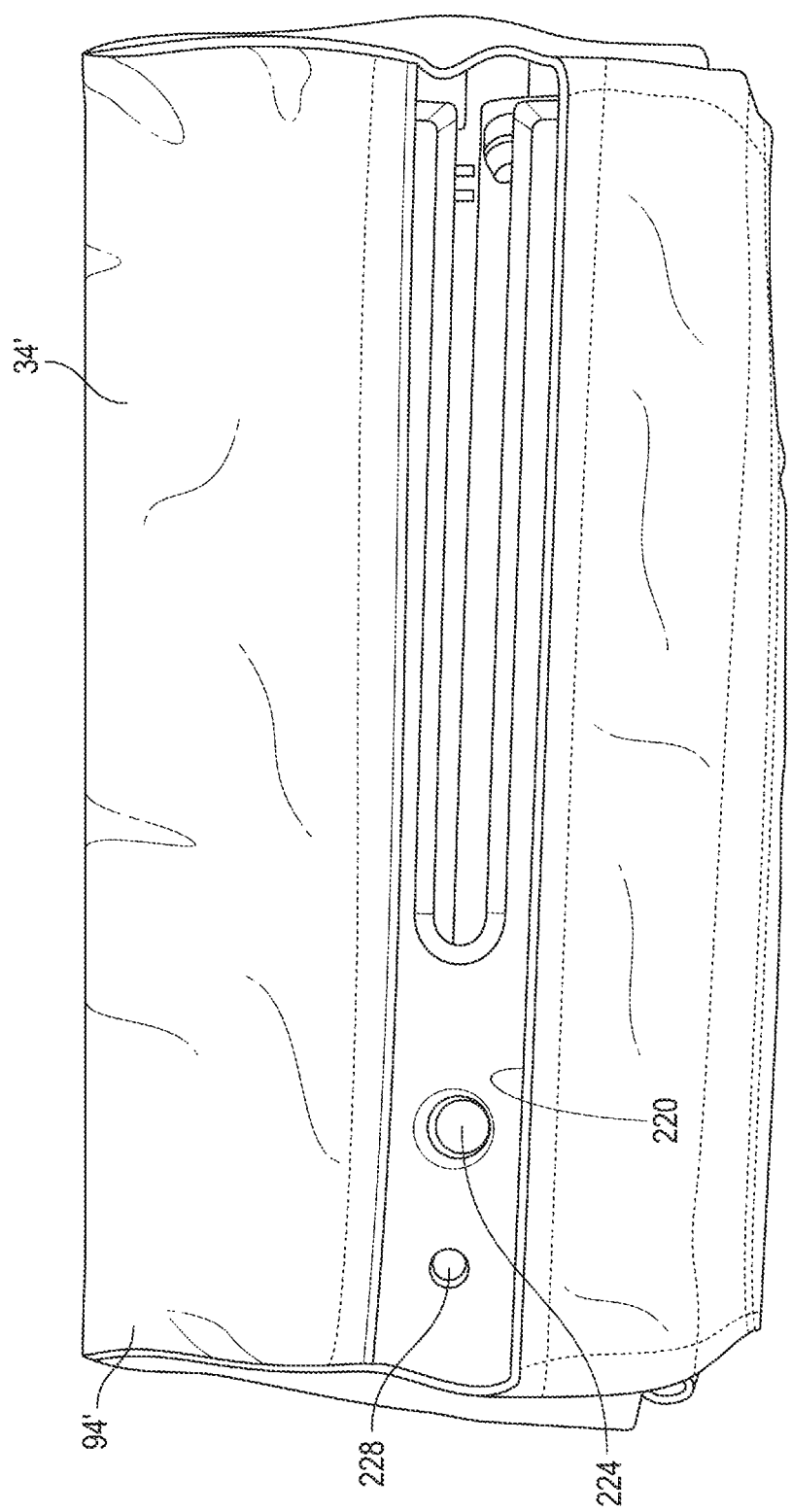
FIG. 18 is a front view of the electronic device heating system of FIG. 14.
Figure 19:
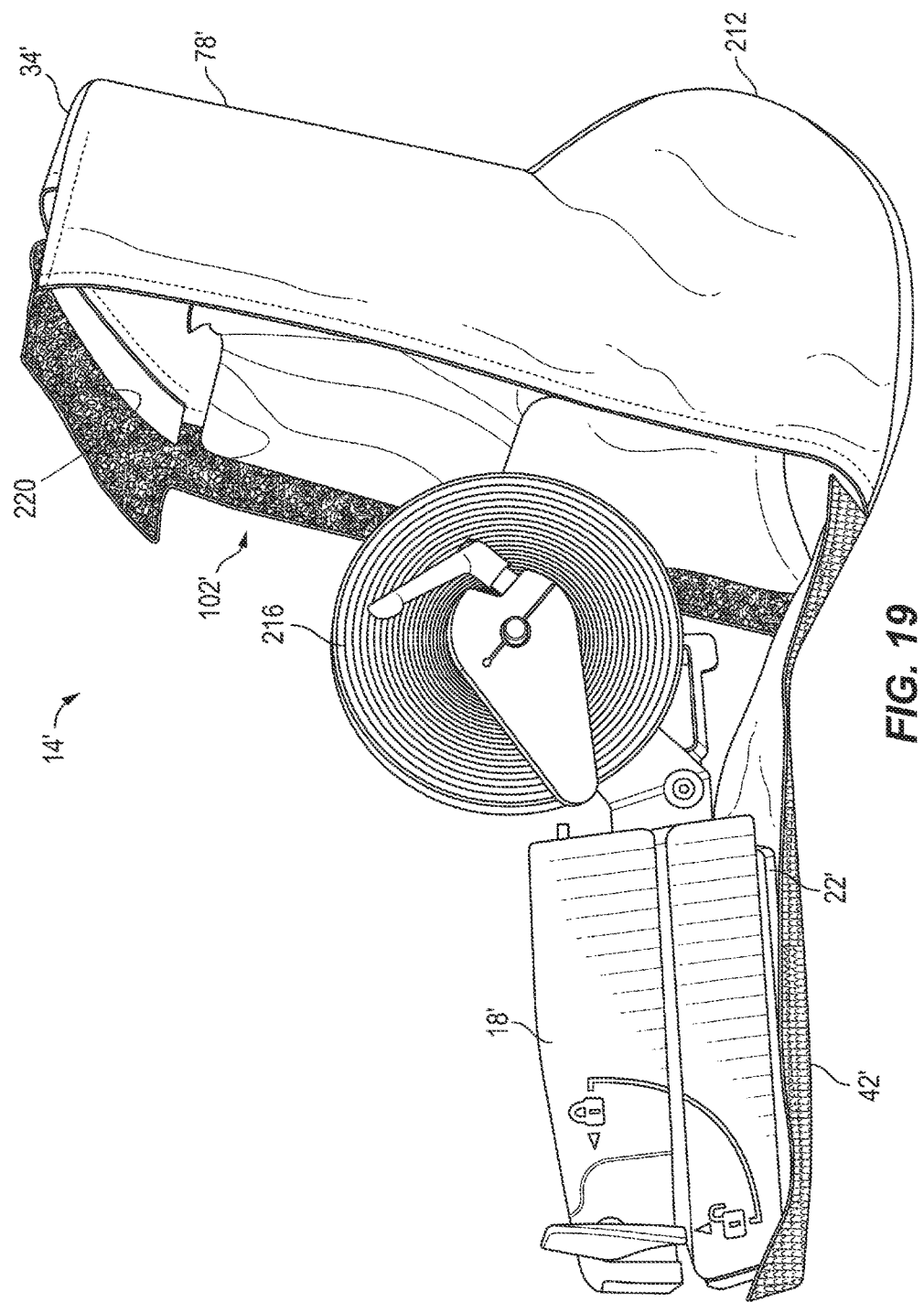
FIG. 19 is a side view of the electronic device heating system of FIG. 14.

Referring now to FIGS. 12 and 13, the second portion 78 supports the heating element 38 (shown schematically) within a pocket 138, that in the illustrated embodiment, extends partially along each of the first, second, and third walls 82, 86, 90. The pocket 138 can be formed by stitching two layers of the cover material together around the heating element 38 to securely couple the heating element 38 to the second portion 78 of the cover 34. In the illustrated embodiment, the heating element 38 is available from Hi-Heat Industries, Inc. of Lewistown, Mont. Of course, other heating elements can also be used. In addition to the heating element 38 being positioned in the pocket 138, insulation 140 (see FIG. 13) can also be provided in the pocket 138 to keep the heat from leaving the cover 34. For example, an insulating layer 140 can be provided between an outside wall of the pocket 138 and the heating element 38 to maximize and retain the heat in the cavity 102.

Figure 9:
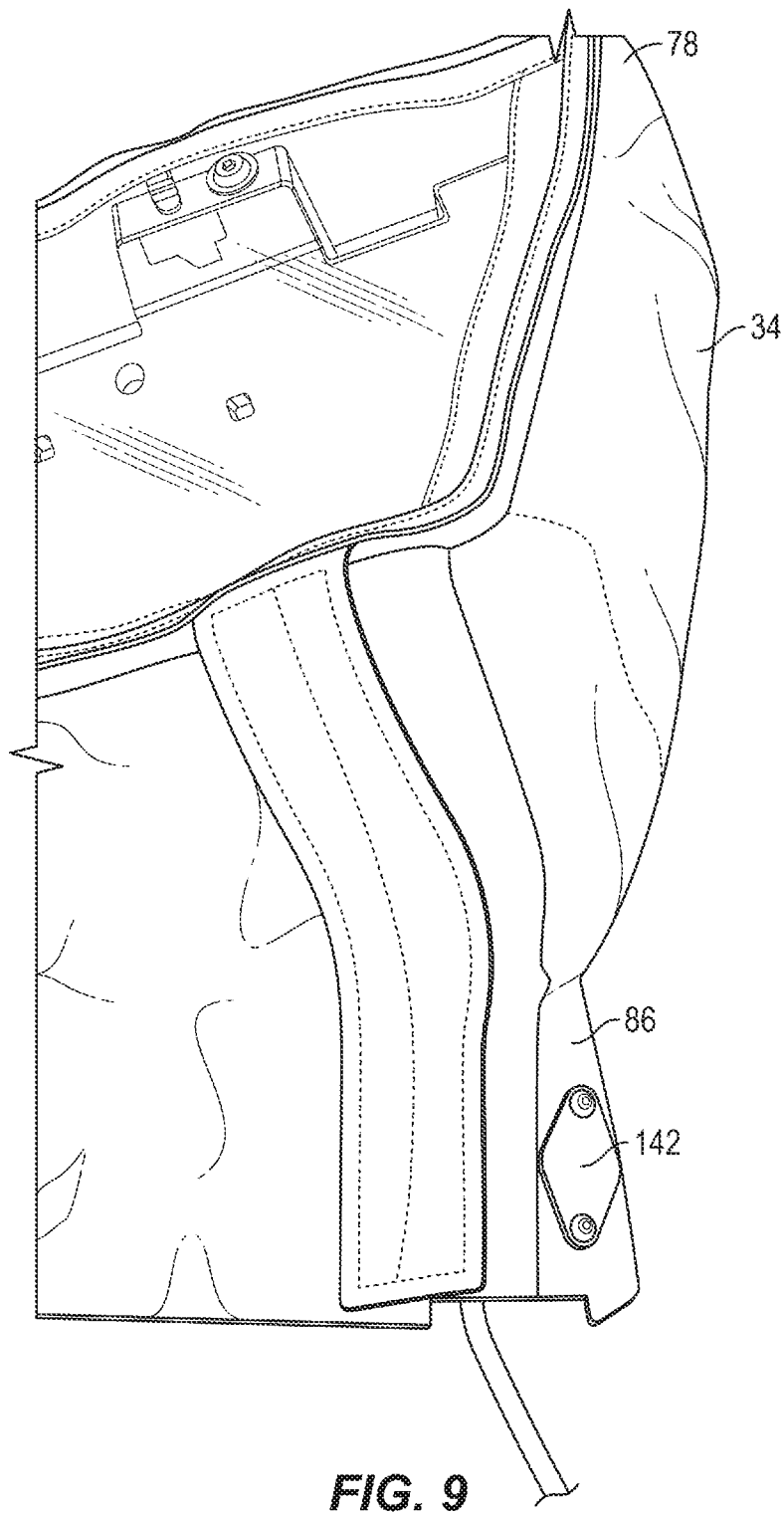
FIG. 9 is a partial perspective view of the electronic device heating system of FIG. 1, showing an external temperature sensor.

The heating element 38 is controlled, in the illustrated embodiment, via one or more temperature sensors (e.g., thermostats, thermocouples, or other electronic temperature sensing devices). FIGS. 8, 9, and 12 illustrate the external temperature sensor 142 that is secured to the second sidewall 86. A lead 146 connects the external temperature sensor 142 to an internal temperature sensor 150 (shown schematically in FIG. 13) and to the heating element 38. The temperature sensors 142 and 150 control operation of the heating element 38 by sensing both the external temperature outside the cover 34 and the internal temperature inside the pocket 138 and the cavity 102. That temperature data controls when the heating element 38 is automatically turned on and off in order to maintain a desirable temperature within the cavity 102. Another set of leads 154 extends from the heating element 38, out of the pocket 138, and out through the bottom wall 94 for connection to a suitable power source.

When the cover 34 is installed over the support 22 and the device 18, it can be moved between a closed position (see FIG. 2) and an open position (see FIG. 3). In the closed position, an outer periphery of the second portion 78 is connected to an outer periphery of the first portion 42 so that the first and second portions 42 and 78 surround and enclose the support 22 and the device 18. In the illustrated embodiment, the outer periphery of the first and second portions 42 and 78 each includes mating hook and loop fasteners 158 that cooperate to connect the first and second portion 42 and 78 together so that the support 22 and device 18 are completely retained between the first and second portions 42 and 78. In this manner, the support 22 and device are within the cavity 102 defined by the second portion 78, and the first portion 42 operates to close off the cavity 102. As shown in FIG. 4, the outer surface 70 of the first portion 42 includes strips of the hook and loop fastener 158 along the left and right side edges. As shown in FIG. 8, there is also a strip of the fastener 158 adjacent the bottom edge of the inner surface 54. These fastener strips 158 cooperate with fastener strips 158 positioned along the lower edges of the walls 82, 86, and 94 of the second portion 78 to releasably connect the first and second portions 42, 78 together at their respective outer peripheries. With this arrangement, the bottom edges of the sidewalls 82, 86 wrap around to the outer surface of the first portion 42 to securely close and encapsulate the support 22 and the device 18. The cavity 102 is completely closed to retain a maximum amount of the heat provided by the heating element 38. In other embodiments, different types of fasteners, such as zippers, snaps, buttons, and the like can be used.

To move the cover 34 to the open position (see FIG. 3), the user can separate the fastener strips 158 and pivot the second portion 78 relative to the first portion 42 such that at least part of the second portion 78 (and its outer periphery) is spaced apart from the first portion 42 to provide access to the device 18 and the support 22. In the illustrated embodiment, the second portion 78 pivots relative to the first portion 42 about a pivot axis 162 defined by a location where the third wall 90 is fixedly connected to the upper edge of the first portion 42. This connection point can be a location where two separate strips of material forming the first portion 42 and the third wall 90 are stitched or otherwise secured together. In other embodiments, the first and second portions 42 and 78 could be integrally joined along the pivot axis 162 via a single piece of material. In yet other embodiments, the connection could be releasable such that the second portion 78 could be pivoted relative to the first portion 42 and then completely removed or separated from the first portion 42.

FIGS. 14-24 illustrate another embodiment of the system 14' in which the device 18' is a printer (e.g., a Datamax O'Neil MP Compact 4 Mark II printer). Like parts have been given like reference numerals designated as prime ('). The construction of the system 14' is very similar to the system 14 described above, such that only the differences will be discussed herein.

Figure 20:
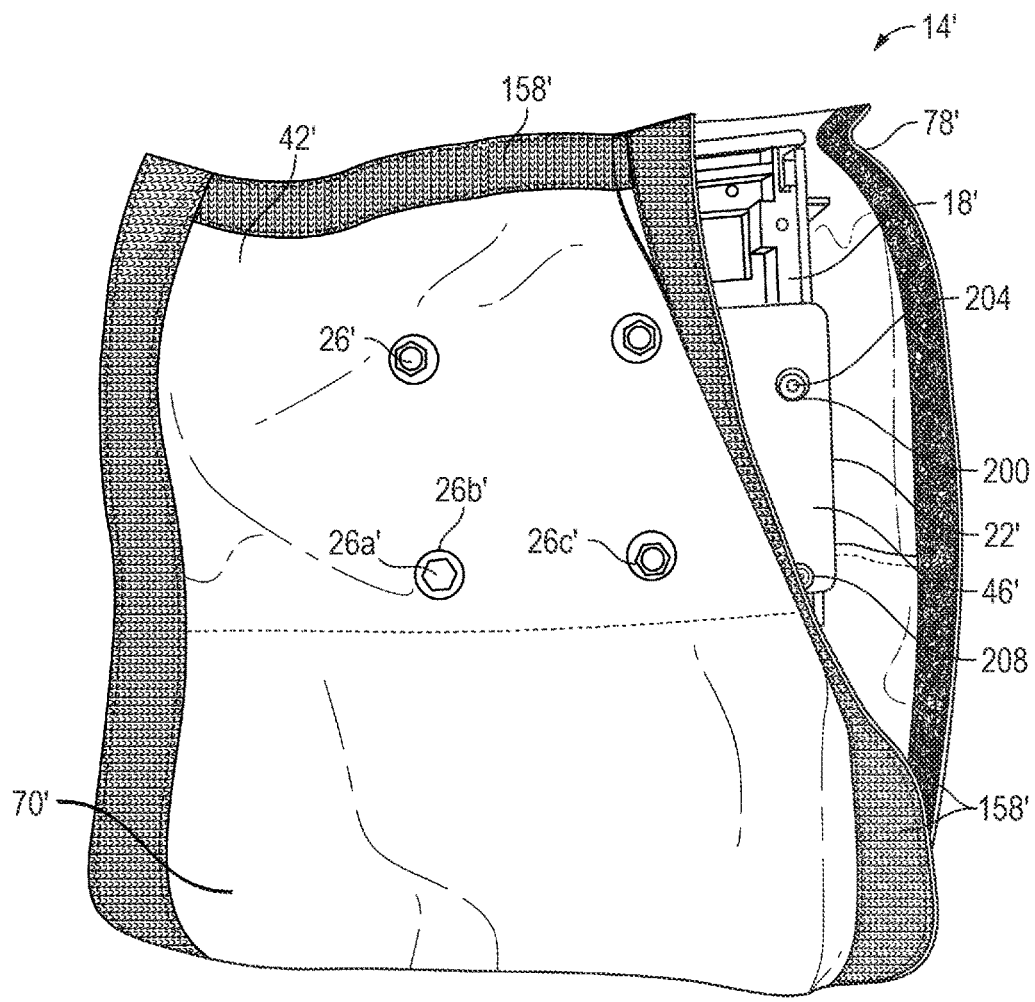
FIG. 20 is a bottom view of the electronic device heating system of FIG. 14 showing part of the first portion folded back to expose part of the support.
Figure 21:
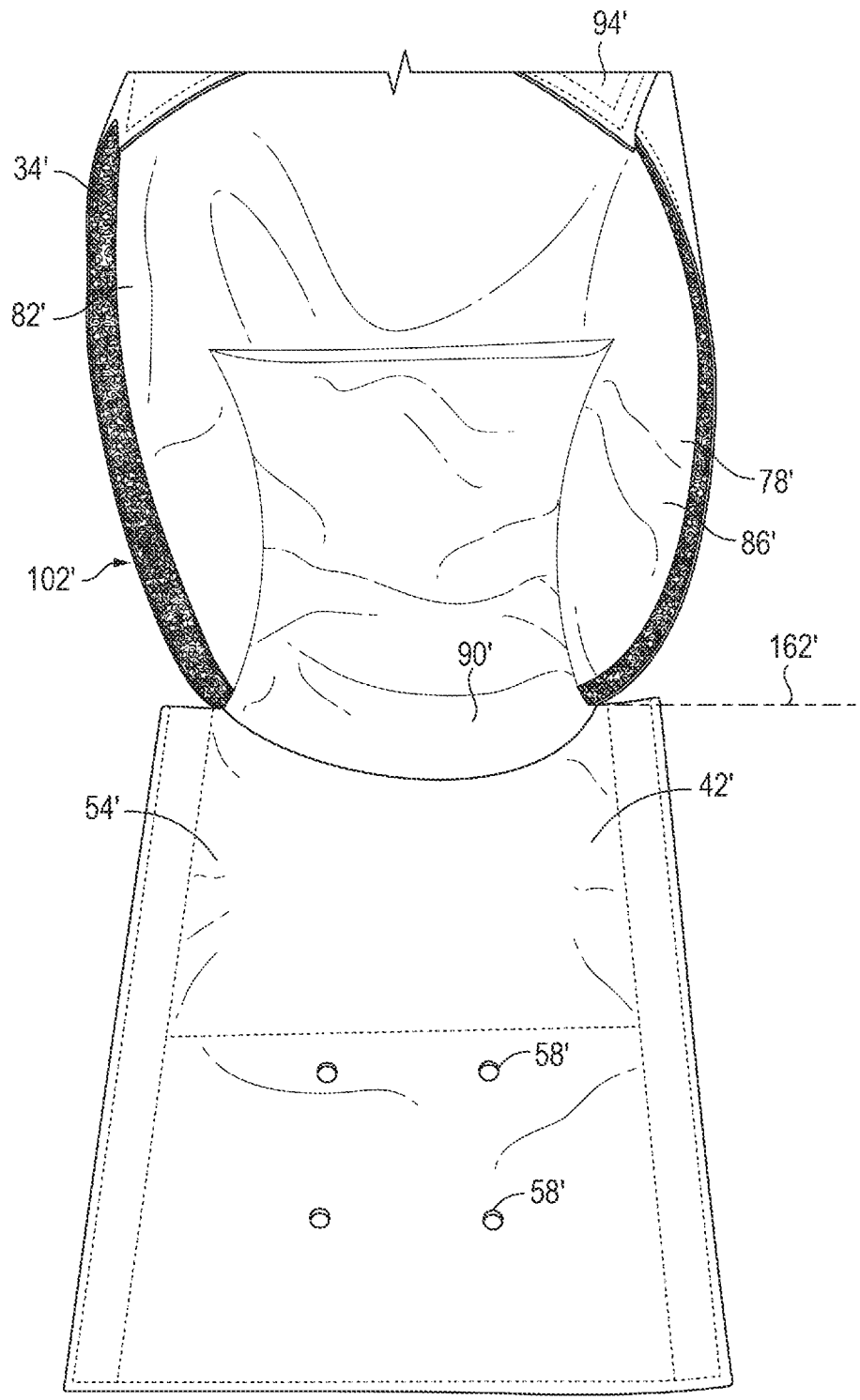
FIG. 21 is a front perspective view of the cover of the electronic device heating system of FIG. 14, shown in the open position.

In this embodiment, the support 22' is a printer mounting bracket to which the printer 18' is fixed. With reference to FIG. 20, the printer mounting bracket 22' is a rigid (e.g., metal) plate having apertures 200 extending therethrough and aligned with apertures 204 in the underside of the printer 18' to receive fasteners 208 that secure the printer 18' to the bracket 22'. The bracket 22' includes mounting members 26' in the form of threaded posts or bolts 26a' that extend from the rear surface 46' of the bracket 22' and extend through the apertures 58' in the first portion 42' of the cover 34'. Washers 26b' and nuts 26c' secure the system 14' to the structure 30, which may be different from the structure 30 used with the system 14. In this embodiment, no separate rigid plate 50 is needed as the bracket 22' is both rigid and generally planar and facilitates a proper fit and placement of the first portion 42' relative to the support 22'.

Another difference with the system 14' is that the outer wall 98' of the second portion 78' is formed with an arcuate protrusion 212 sized and configured to cover a roll of paper and/or labels 216 coupled to the printer 18'. In this manner, the cavity 102' is shaped differently from the cavity 102 of the system 14 to accommodate the different device 18'. Additionally, the outer wall 98' of the system 14' does not include any translucent material, as there is no need to see or interact with the top side of the printer 18'.

The fourth wall 94' of the second portion 78' includes an opening 220 that provides access into and out of the cavity 102'. This opening 220 allows the paper from the printer 18' to be expelled from inside the cavity 102' after a print job is completed. The opening 220 also provides access to an input button 224 (e.g., an on/off button) and also enables viewing of a light 228 or other control indicia.

Figure 22:
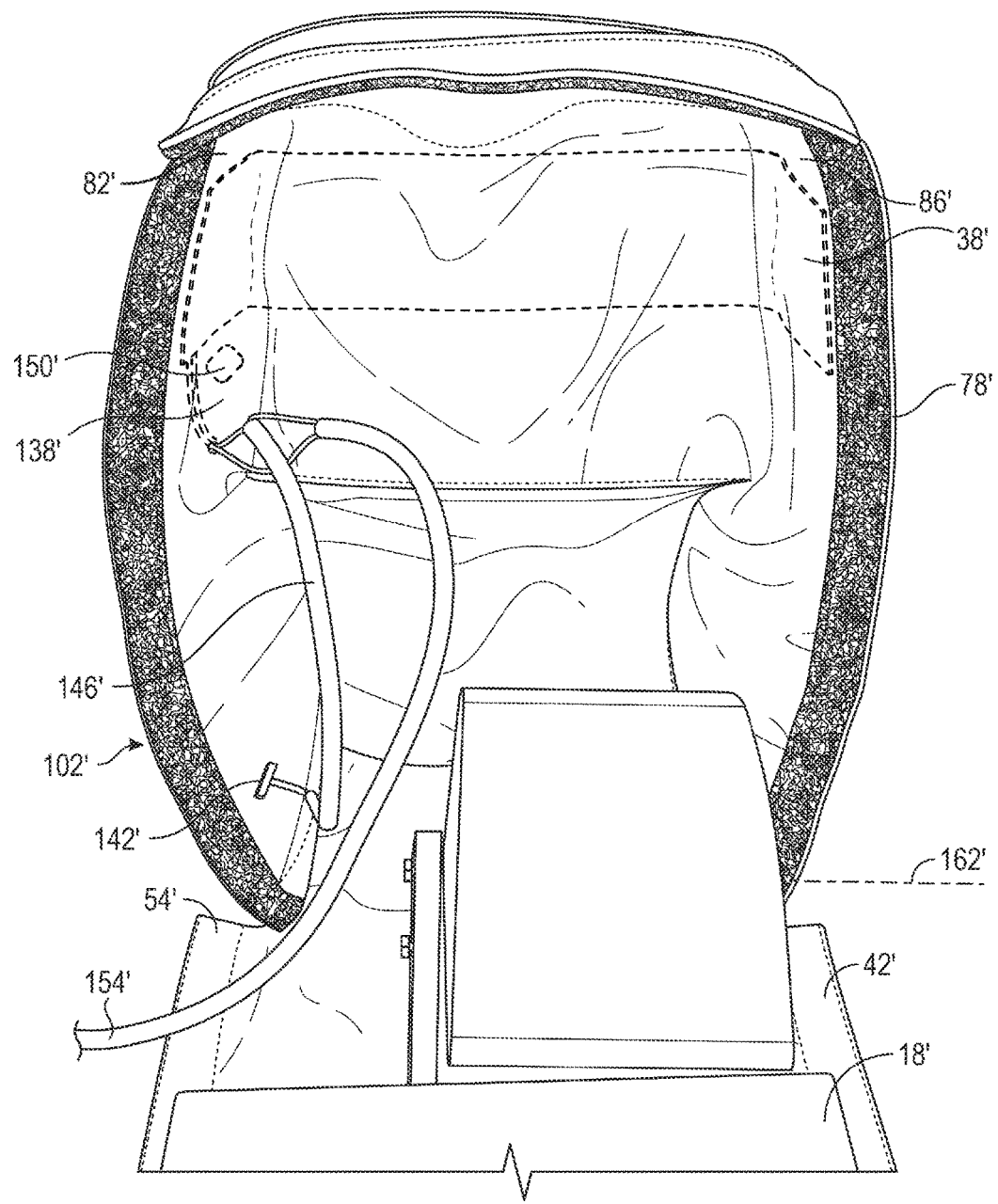
FIG. 22 is an enlarged partial front perspective view of the cover of the electronic device heating system of FIG. 14, shown in the open position.
Figure 23:
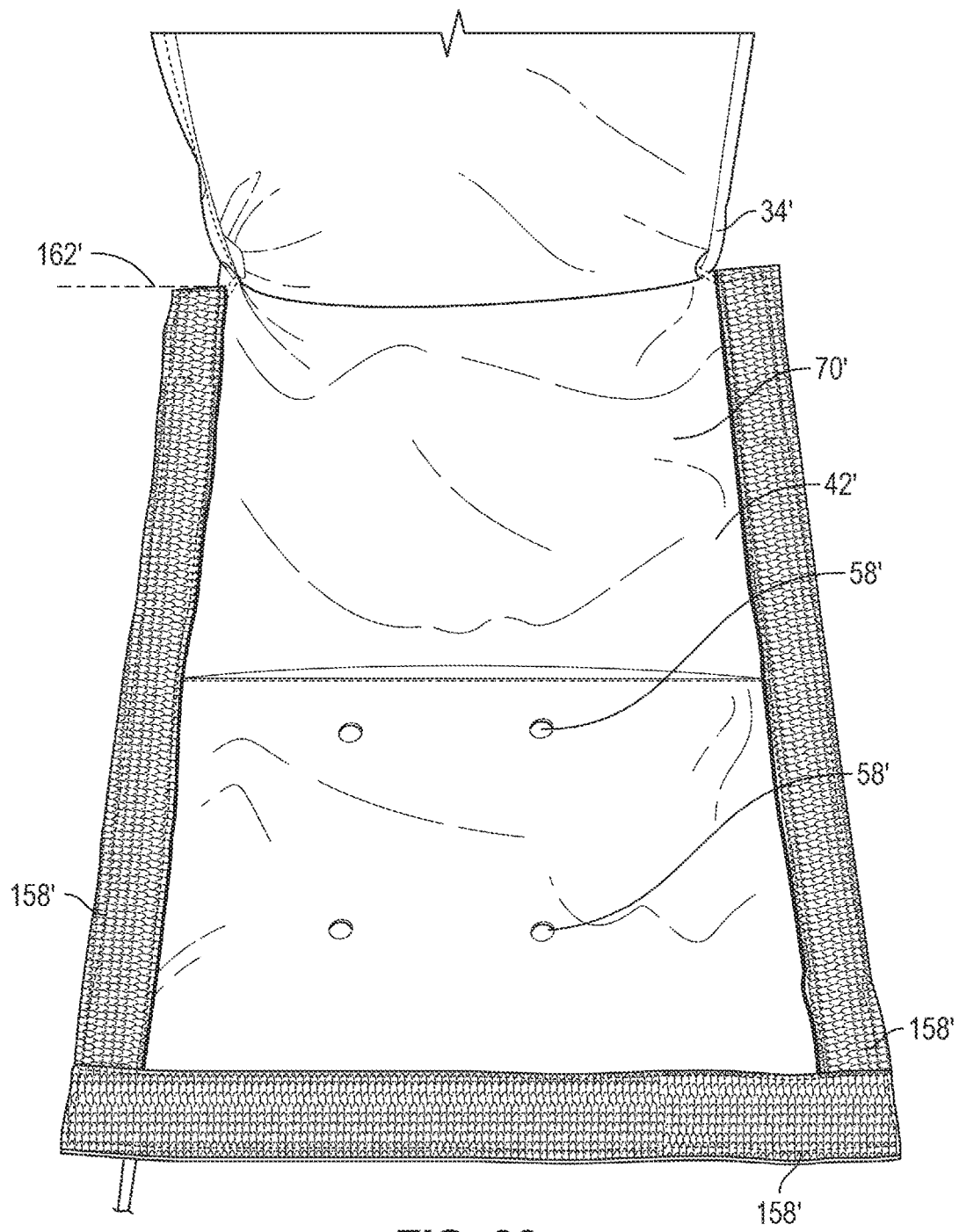
FIG. 23 is an enlarged partial front perspective view of the cover of the electronic device heating system of FIG. 14, shown in the open position.
Figure 24:
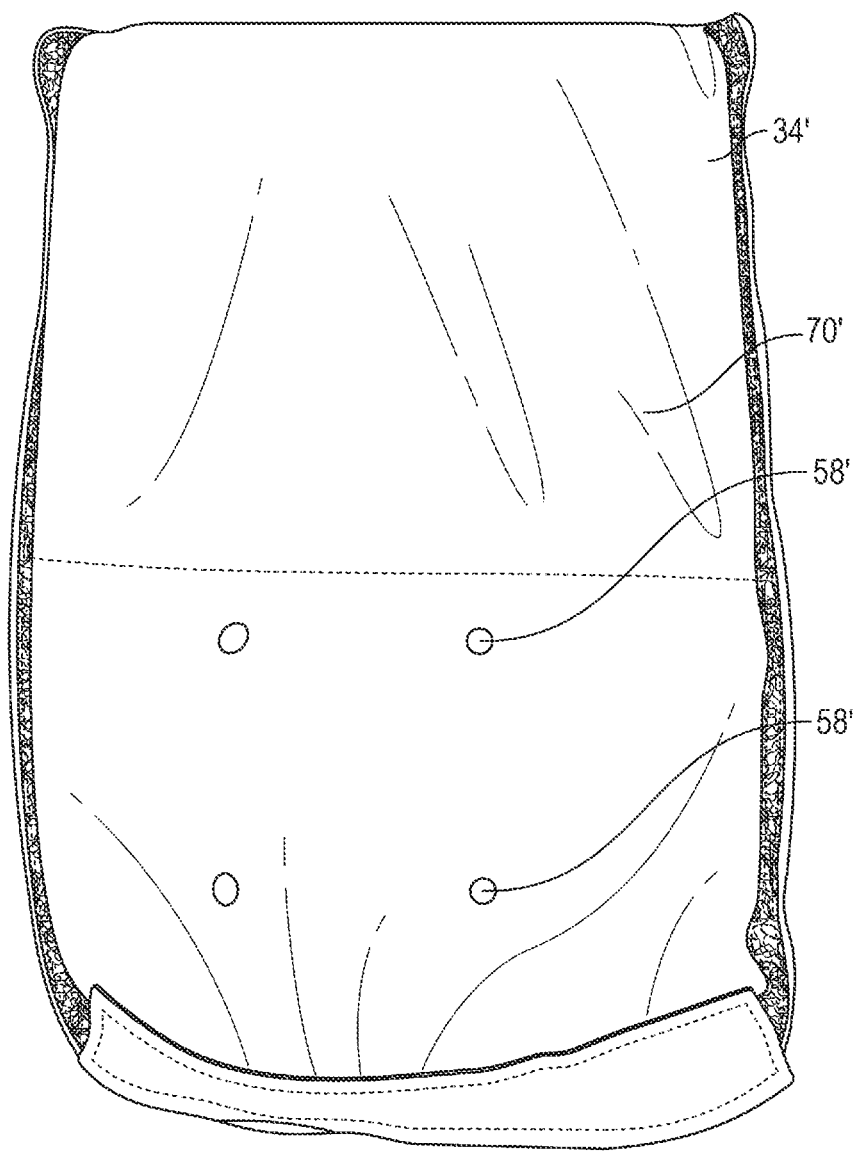
FIG. 24 is a bottom view of the cover of the electronic device heating system of FIG. 14.

With reference to FIG. 22, the heating element 38' (shown schematically) is positioned within a pocket 138' formed in the fabric material and that extends over portions of the first sidewall 82', the outer wall 98', and the second sidewall 86' adjacent to the printer 18'. In this manner, the heating element 38' is positioned in the appropriate location to apply the heat to the printer 18'. As with the system 14, the system 14' includes an external temperature sensor 142' and an internal temperature sensor 150' (shown schematically) to control the operation of the heating element 38'.

Other differences include the lack of a flap 66 (due to the mounting orientation of the system 14'), the lack of a flap 126 in the bottom wall 94', the placement of the external temperature sensor 142' in the first sidewall 82' instead of the second sidewall 86', minor variations in the placement of the fastener strips 158', and geometry variations to accommodate the different size/shape of the support 22' and the device 18'.

Various features and advantages of the invention are set forth in the following claims.

What is claimed is:

1. A system comprising:
   a support for an electronic device;
   a cover for surrounding the support, the cover including
      a first portion defining a back of the cover to be positioned behind the support, the first portion including at least one aperture;
      a second portion defining a front of the cover, the second portion defining therein a cavity sized and configured such that when connected to the first portion about an outer periphery of the second portion, the cavity encloses the support;
   wherein the second portion is pivotable relative to the first portion between a closed position, in which the outer periphery of the second portion is connected to the first portion, and an open position, in which at least part of the outer periphery of the second portion is spaced apart from the first portion;
   wherein the second portion includes an outer wall having an opening therein, and a translucent material covering the opening for viewing the electronic device through the cover when the second portion is in the closed position; and
   a heating element positioned within a pocket formed in to the second portion and operable to heat the cavity, wherein the second portion includes a first sidewall, a second sidewall spaced from and parallel to the first sidewall, and a third wall interconnecting the first and second sidewalls, the pocket extending at least partially on to each of the first sidewall, the second sidewall, and the third wall;

a mounting member coupled to the support and extending through the at least one aperture in the first portion of the cover; and a structure to which the support, the cover, and the mounting member are secured, wherein the mounting member secures the support and the cover to the structure by extending from the support, through the at least one aperture in the first portion of the cover, and into engagement with the structure.

2. The system of claim 1, further comprising an electronic device supported on the support, wherein the cavity encloses the electronic device and the support when the second portion is connected to the first portion about an outer periphery of the second portion.

3. The system of claim 2, wherein the electronic device is a tablet computer, and wherein the support is a docking station.

4. The system of claim 2, wherein the electronic device is a printer, and wherein the support is a mounting bracket.

5. The system of claim 1, wherein the first and second portions are connected together along a pivot axis defined between the first and second portions.

6. The system of claim 1, wherein the first and second portions are integrally joined at a pivot axis defined between the first and second portions.

7. The system of claim 1, further including a rigid plate configured to engage an inner surface of the first portion, the rigid plate including at least one aperture aligned with the at least one aperture in the first portion and through which the mounting member extends.

8. The system of claim 1, wherein the translucent material is removably coupled to the second portion using a fastener arrangement.

9. The system of claim 8, wherein the fastener arrangement includes hook and loop fasteners.

10. The system of claim 1, where the outer periphery of the second portion includes a fastener arrangement for securing the outer periphery of the second portion to the first portion.

11. The system of claim 10, wherein the fastener arrangement includes hook and loop fasteners on the first and second portions.

12. The system of claim 1, further including insulation positioned in the pocket with the heating element.

13. The system of claim 1, wherein the second portion further includes a fourth wall opposite the third wall and extending between the first and second sidewalls, the fourth wall including a flap at least partly releasably engaged with a remainder of the fourth wall to provide access for connectors to extend from inside of the cavity to outside of the cover through the fourth wall.

14. The system of claim 13, wherein the flap is at least partly releasably engaged with a remainder of the fourth wall using hook and loop fasteners.

15. The system of claim 1, further comprising a temperature sensor electrically connected to the heating element and operable to detect a temperature outside of the cover, the heating element being operable based on the temperature detected by the temperature sensor.

16. The system of claim 1, further comprising a movable flap coupled to an outside surface of the first portion and aligned with the at least one aperture to inhibit entry of water into the cavity through the at least one aperture.

17. The system of claim 3, wherein the mounting member includes a bolt extending from the docking station and a nut for securing the bolt to the structure.

18. A system comprising:
a support for an electronic device;
a cover for surrounding the support, the cover including
a first portion defining a back of the cover to be positioned behind the support, the first portion including at least one aperture;
a second portion defining a front of the cover, the second portion defining therein a cavity sized and configured such that when connected to the first portion about an outer periphery of the second portion, the cavity encloses the support;
wherein the second portion is pivotable relative to the first portion between a closed position, in which the outer periphery of the second portion is connected to the first portion, and an open position, in which at least part of the outer periphery of the second portion is spaced apart from the first portion;
wherein the second portion includes an outer wall having an opening therein for providing access into and out of the cavity; and
a heating element positioned within a pocket formed in the second portion and operable to heat the cavity, wherein the second portion includes a first sidewall, a second sidewall spaced from and parallel to the first sidewall, and a third wall interconnecting the first and second sidewalls, the pocket extending at least partially on to each of the first sidewall, the second sidewall, and the third wall;
a mounting member coupled to the support and extending through the at least one aperture in the first portion of the cover; and
a structure to which the support, the cover, and the mounting member are secured, wherein the mounting member secures the support and the cover to the structure by extending from the support, through the at least one aperture in the first portion of the cover, and into engagement with the structure.

19. The system of claim 18, wherein the second portion includes an arcuate protrusion sized and configured to cover a roll of paper housed within the cavity.

20. The system of claim 18, further comprising an electronic device supported on the support, wherein the cavity encloses the electronic device and the support when the second portion is connected to the first portion about an outer periphery of the second portion.

21. The system of claim 20, wherein the electronic device is a tablet computer, and wherein the support is a docking station.

22. The system of claim 21, wherein the mounting member includes a bolt extending from the docking station and a nut for securing the bolt to the structure.

23. The system of claim 20, wherein the electronic device is a printer, and wherein the support is a mounting bracket.

24. The system of claim 23, wherein the mounting member includes a bolt extending from the mounting bracket and a nut for securing the bolt to the structure.

* * * * *